(12) United States Patent
Hong et al.

(10) Patent No.: US 10,651,197 B2
(45) Date of Patent: May 12, 2020

(54) 3D SEMICONDUCTOR DEVICES INCLUDING A SUPPORTER AND METHODS OF FORMING THE SAME

(71) Applicant: Samsung Electronics Co., Ltd., Suwon-si, Gyeonggi-do (KR)

(72) Inventors: Sang Jun Hong, Hwaseong-si (KR); Ee Jou Kim, Hwaseong-si (KR); Joong Shik Shin, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/192,232

(22) Filed: Nov. 15, 2018

(65) Prior Publication Data
US 2019/0355740 A1  Nov. 21, 2019

(30) Foreign Application Priority Data
May 21, 2018  (KR) ........................ 10-2018-0057636

(51) Int. Cl.
| H01L 27/11582 | (2017.01) |
| H01L 27/11565 | (2017.01) |
| H01L 21/768 | (2006.01) |
| H01L 29/792 | (2006.01) |
| H01L 27/11573 | (2017.01) |
| H01L 27/11551 | (2017.01) |
| H01L 27/11524 | (2017.01) |
| H01L 27/11529 | (2017.01) |

(52) U.S. Cl.
CPC .. *H01L 27/11582* (2013.01); *H01L 21/76877* (2013.01); *H01L 27/11524* (2013.01); *H01L 27/11529* (2013.01); *H01L 27/11551* (2013.01); *H01L 27/11565* (2013.01); *H01L 27/11573* (2013.01); *H01L 29/7926* (2013.01)

(58) Field of Classification Search
CPC ........ H01L 27/11582; H01L 27/11524; H01L 27/11529; H01L 27/11551; H01L 27/11573; H01L 29/7926
See application file for complete search history.

(56) References Cited

U.S. PATENT DOCUMENTS

| 8,564,050 | B2 | 10/2013 | Park |
| 8,581,330 | B2 | 11/2013 | Kiyotoshi |
| 9,224,752 | B1 | 12/2015 | Lee |
| 9,306,040 | B2 | 4/2016 | Choi |
| 9,853,038 | B1 | 12/2017 | Cui |

(Continued)

FOREIGN PATENT DOCUMENTS

| JP | 2013038124 | 2/2013 |
| KR | 20140122057 | 10/2014 |
| KR | 20160109971 | 9/2016 |

*Primary Examiner* — Joseph C. Nicely
(74) *Attorney, Agent, or Firm* — Myers Bigel, P.A.

(57) ABSTRACT

A semiconductor device comprises a lower conductive layer on a substrate. A conductive line is on the lower conductive layer. A buried trench in the conductive line is provided. A supporter which is on the conductive line and extends in the buried trench is provided. A stack structure including a plurality of insulating layers and a plurality of conductive layers that are alternately stacked is on the supporter. A channel structure passing through the stack structure, the supporter, and the conductive line is provided. An isolation trench passing through the stack structure, the supporter, and the conductive line is provided.

20 Claims, 20 Drawing Sheets

(56) References Cited

U.S. PATENT DOCUMENTS

| | | |
|---|---|---|
| 9,917,100 B2 | 3/2018 | Zhang |
| 2018/0006054 A1 | 1/2018 | Liu |
| 2018/0166454 A1* | 6/2018 | Pyon ................. H01L 27/11286 |
| 2018/0366486 A1* | 12/2018 | Hada ................. H01L 27/11582 |
| 2019/0333922 A1* | 10/2019 | Jung ................... H01L 27/1157 |
| 2019/0333931 A1* | 10/2019 | Jung ................. H01L 27/11524 |
| 2019/0355741 A1* | 11/2019 | Lee .................... H01L 27/1157 |

\* cited by examiner

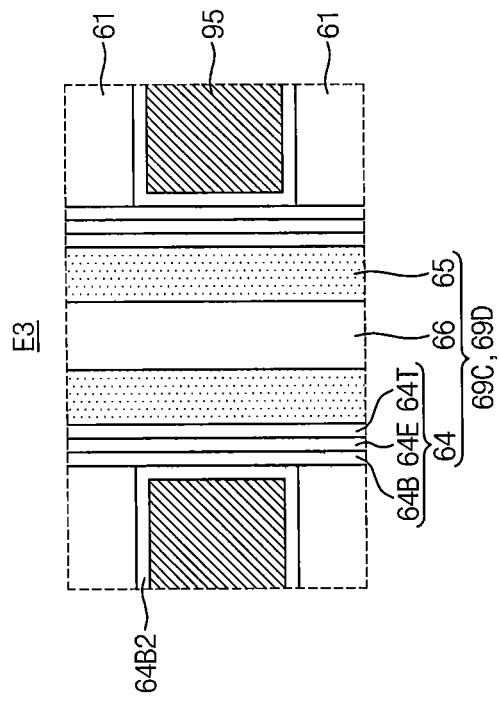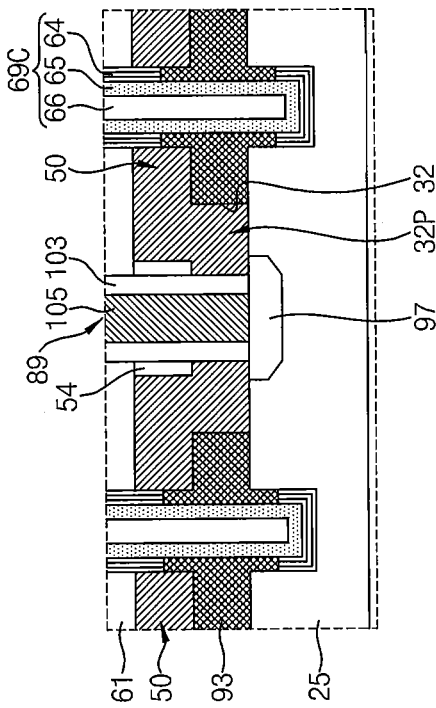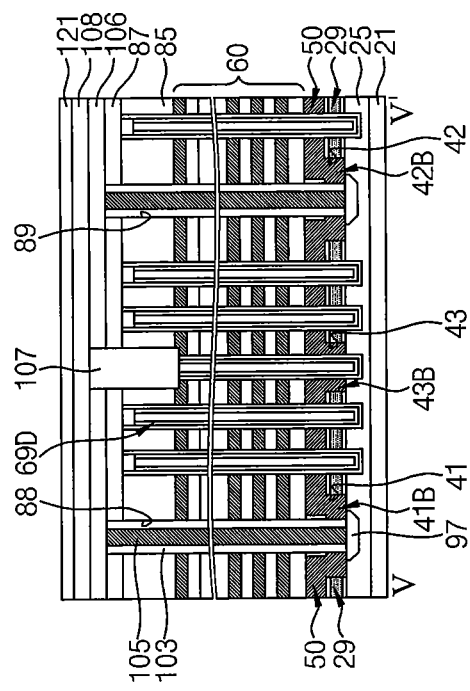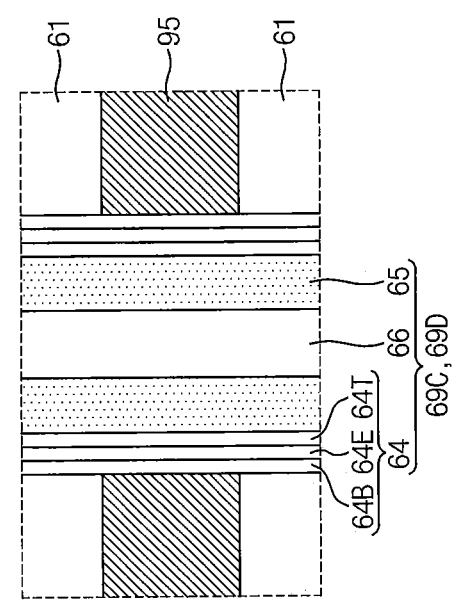

E2

E1

E2

E1

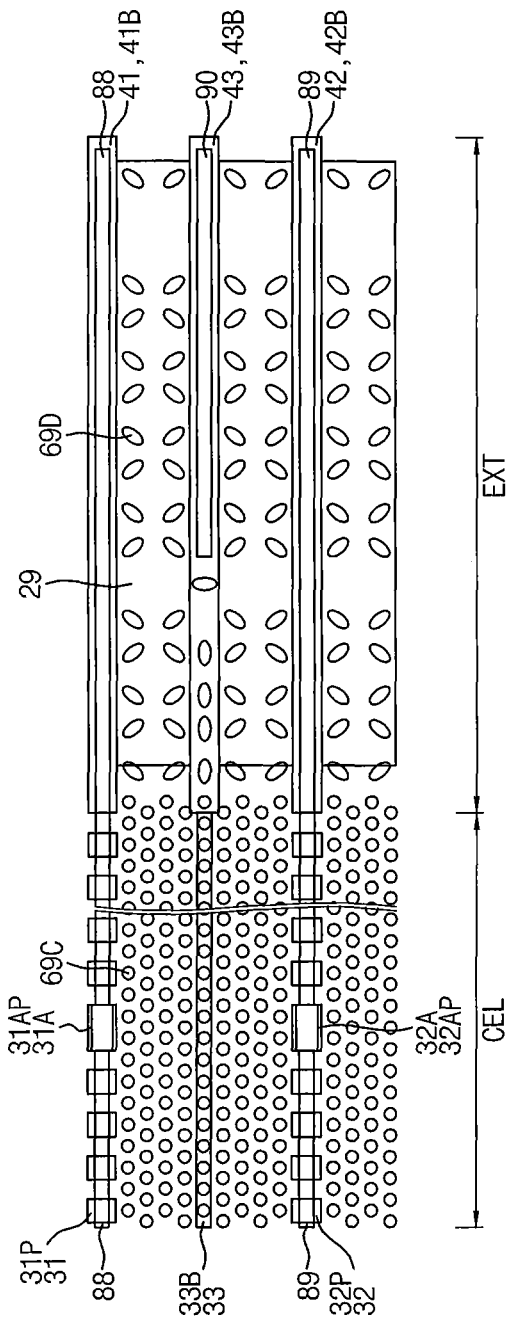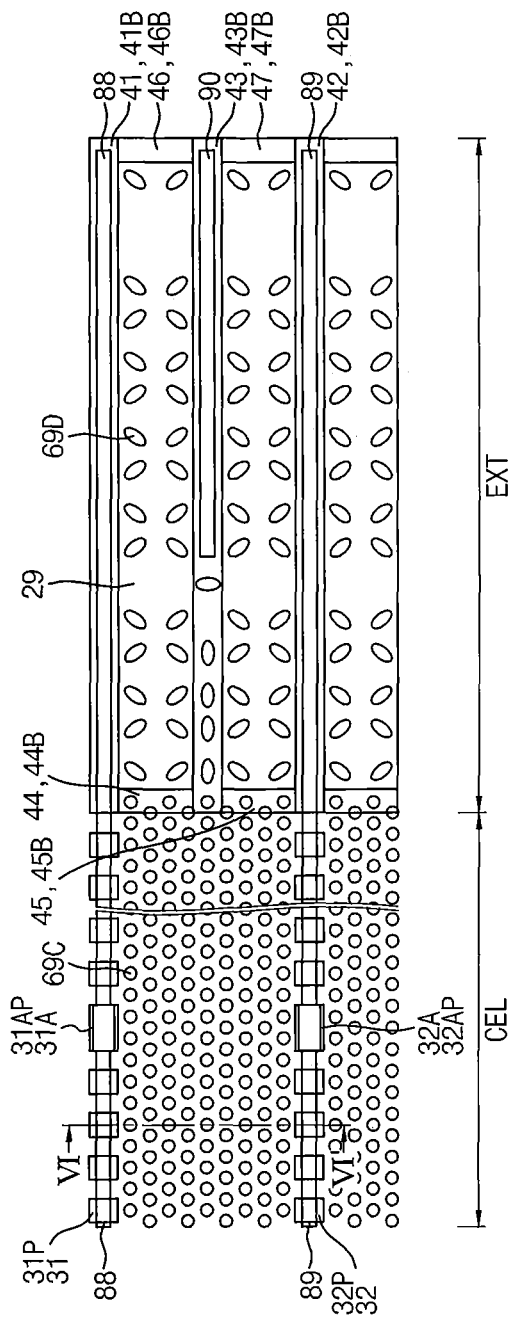

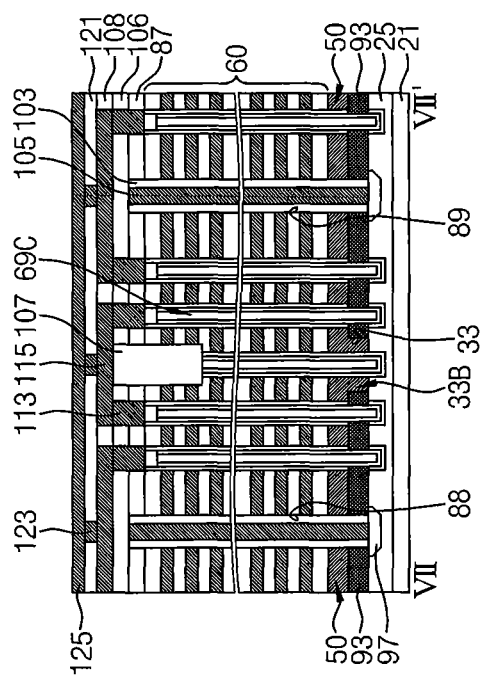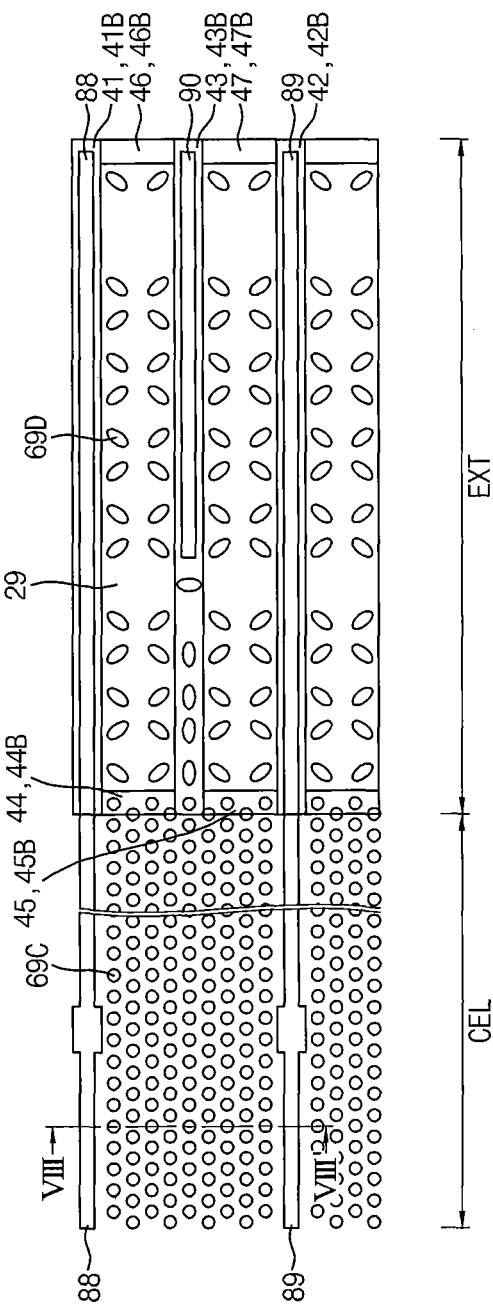

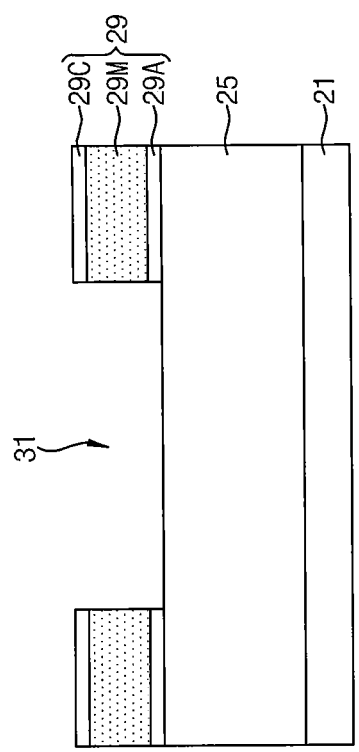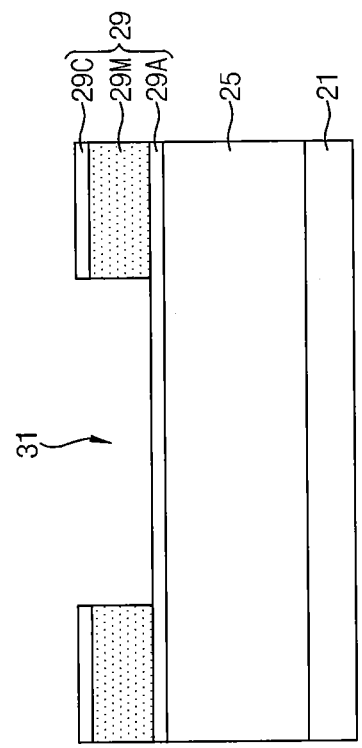

E5

E4

3D SEMICONDUCTOR DEVICES INCLUDING A SUPPORTER AND METHODS OF FORMING THE SAME

CROSS-REFERENCE TO RELATED APPLICATION

This U.S. non-provisional patent application claims priority under 35 U.S.C. § 119 to, and the benefit of, Korean Patent Application No. 10-2018-0057636, filed on May 21, 2018, in the Korean Intellectual Property Office (KIPO), the entire contents of which are incorporated herein by reference.

BACKGROUND

Field of the Invention

Devices and methods consistent with example embodiments of the inventive concepts relate to three-dimensional (3D) semiconductor devices including a supporter and methods of forming the same.

Discussion of Related Art

Due, in part, to the benefits of high integration in semiconductor devices, memory devices employing a three-dimensional stack structure have been studied. In such structures, a sacrificial layer and a stack structure may be sequentially formed on a substrate. A gap region may be formed by removing the sacrificial layer. A replacement electrode may be formed in the gap region. Various difficulties, such as the collapse of the stack structure, may occur in the process of forming the gap region.

SUMMARY OF THE INVENTION

The example embodiments of the inventive concepts are directed to providing 3D semiconductor devices having a stable structure with a simplified process, and methods of forming the same.

According to example embodiments of the inventive concepts, there is provided a semiconductor device including a lower conductive layer on a substrate. A conductive line is on the lower conductive layer. A buried trench in the conductive line is provided. A supporter which is on the conductive line and extends in the buried trench is provided. A stack structure including a plurality of insulating layers and a plurality of conductive layers that are alternately stacked is on the supporter. A channel structure passing through the stack structure, the supporter, and the conductive line is provided. An isolation trench passing through the stack structure, the supporter, and the conductive line is provided.

According to example embodiments of the inventive concepts, there is provided a semiconductor device including a substrate having a cell region and a pad region. A lower conductive layer is on the substrate. A mold layer in the pad region on the lower conductive layer is provided. A conductive line in the cell region on the lower conductive layer and at a substantially same level as the mold layer is provided. A plurality of buried trenches in conductive line and the mold layer are provided. A supporter which is on the conductive line and the mold layer and extends in the plurality of buried trenches is provided. A stack structure including a plurality of insulating layers and a plurality of conductive layers that are alternately stacked is on the supporter. A cell channel structure passing through the stack structure, the supporter, and the conductive line is provided. A dummy channel structure passing through the stack structure, the supporter, and the mold layer is provided. A plurality of isolation trenches passing through the stack structure, the supporter, and the conductive line are provided.

According to example embodiments of the inventive concepts, there is provided a semiconductor device including a substrate having a cell region and a pad region adjacent to the cell region. A lower conductive layer is on the substrate. A mold layer in the pad region on the lower conductive layer is provided. A conductive line in the cell region on the lower conductive layer and at a substantially same level as the mold layer is provided. A first extension buried trench in the mold layer is provided. A second extension buried trench which is spaced apart from the first extension buried trench and in the mold layer is provided. A supporter which is on the conductive line and the mold layer and extends in the first extension buried trench and the second extension buried trench is provided. A stack structure including a plurality of insulating layers and a plurality of conductive layers that are alternately stacked is on the supporter is provided. A plurality of cell channel structures passing through the stack structure, the supporter, and the conductive line are provided. A plurality of dummy channel structures passing through the stack structure, the supporter, and the mold layer between the first extension buried trench and the second extension buried trench are provided. A plurality of isolation trenches passing through the stack structure, the supporter, and the conductive line are provided.

According to example embodiments of the inventive concepts, a semiconductor device may include a lower conductive layer on a substrate, a conductive line on the lower conductive layer, a buried trench in the conductive line, a supporter on the conductive line and extending in the buried trench, a stack structure comprising a plurality of insulating layers and a plurality of conductive layers that are alternately stacked on the supporter, a channel structure that passes through the stack structure, the supporter, and the conductive line, and an isolation trench that passes through the stack structure, the supporter, and the conductive line. The buried trench may be spaced apart from the isolation trench.

According to example embodiments of the inventive concepts, there is provided a method of forming a semiconductor device including forming a lower conductive layer on a substrate. A mold layer is formed on the lower conductive layer. A trench in the mold layer is formed. A supporter which is on the mold layer and extends in the trench is formed. A preliminary stack structure including a plurality of insulating layers and a plurality of sacrificial layers that are alternately stacked is formed on the supporter. A channel structure passing through the preliminary stack structure, the supporter, and the mold layer is formed. An isolation trench passing through the preliminary stack structure, the supporter, and the mold layer is formed. A cavity is formed by removing the mold layer. A conductive line is formed in the cavity. A plurality of gap regions are formed by removing the plurality of sacrificial layers. A plurality of conductive layers are formed in the plurality of gap regions. The plurality of insulating layers and the plurality of conductive layers that are alternately stacked on the supporter constitute a stack structure.

BRIEF DESCRIPTION OF THE DRAWINGS

FIGS. 2 and 3 are cross-sectional views for describing the 3D semiconductor device according to the example embodiment of the inventive concepts, and FIGS. 4 to 11 are enlarged views showing a portion of FIG. 2 in detail.

FIGS. 12 to 14, 16, and 18 are layouts for describing 3D semiconductor devices according to example embodiments of the inventive concepts.

FIGS. 15, 17, and 19 to 22 are cross-sectional views for describing the 3D semiconductor devices according to the example embodiments of the inventive concepts.

FIGS. 26 and 27 are enlarged views showing a portion of FIG. 25 in detail.

DETAILED DESCRIPTION

Figure 1:
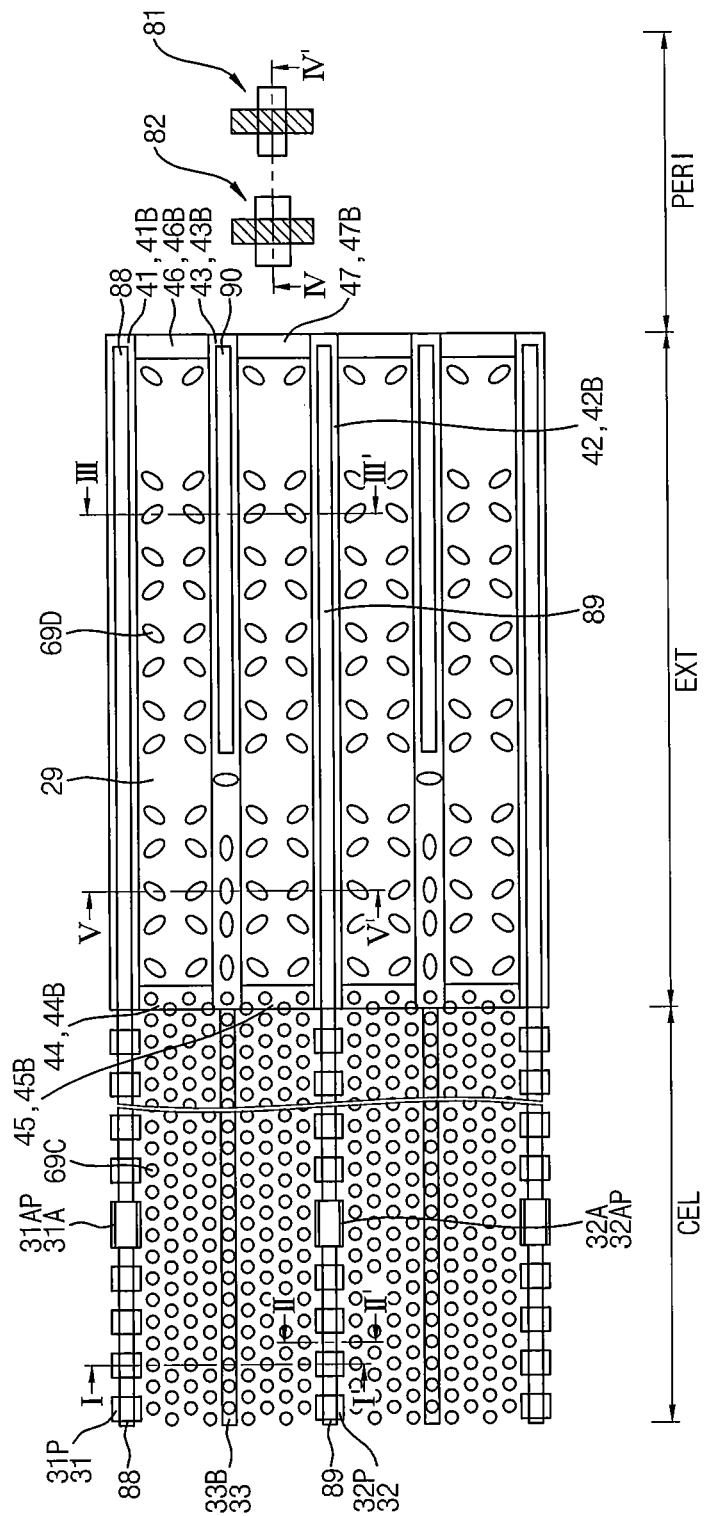
FIG. 1 is a layout for describing a 3D semiconductor device according to an example embodiment of the inventive concepts.
Figure 2:
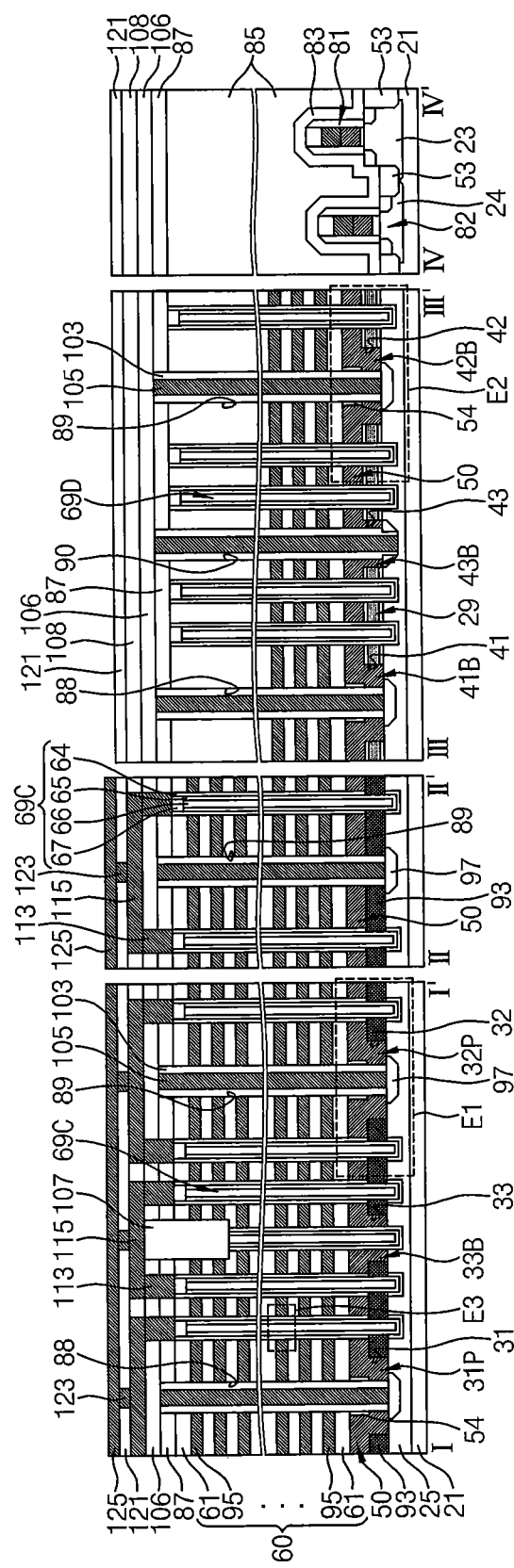
Figure 7:
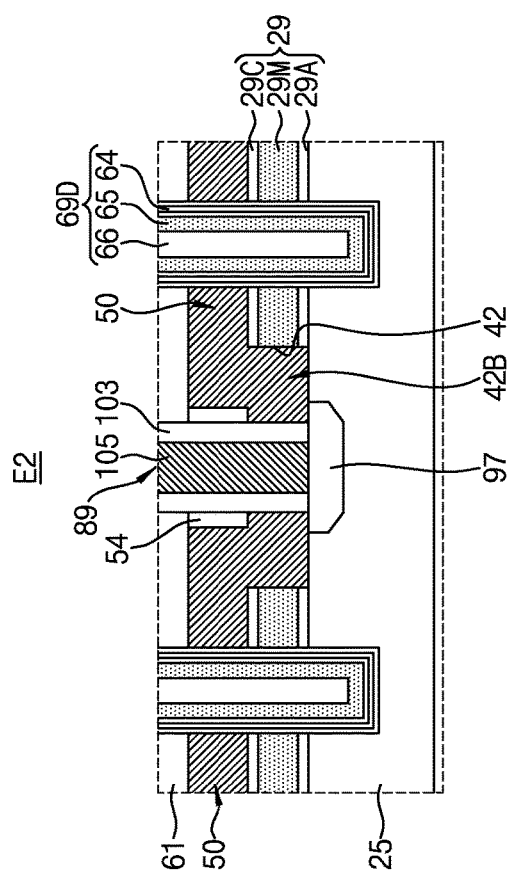
Figure 8:
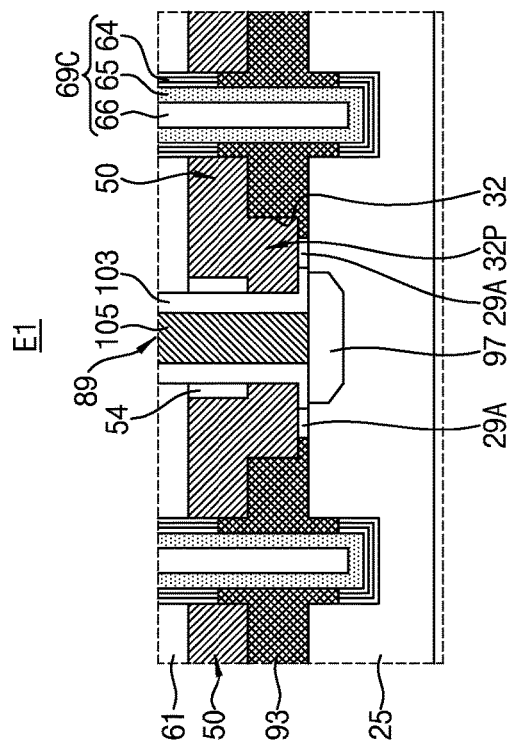
Figure 9:
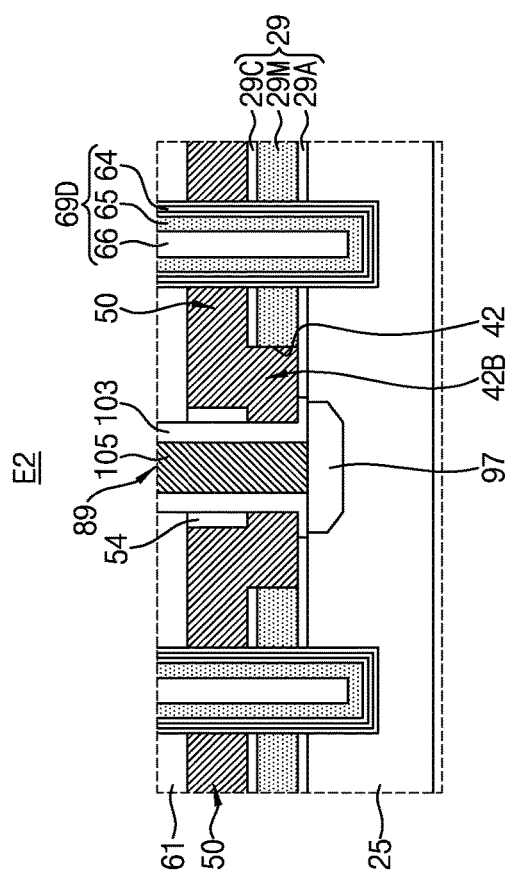
Figure 10:
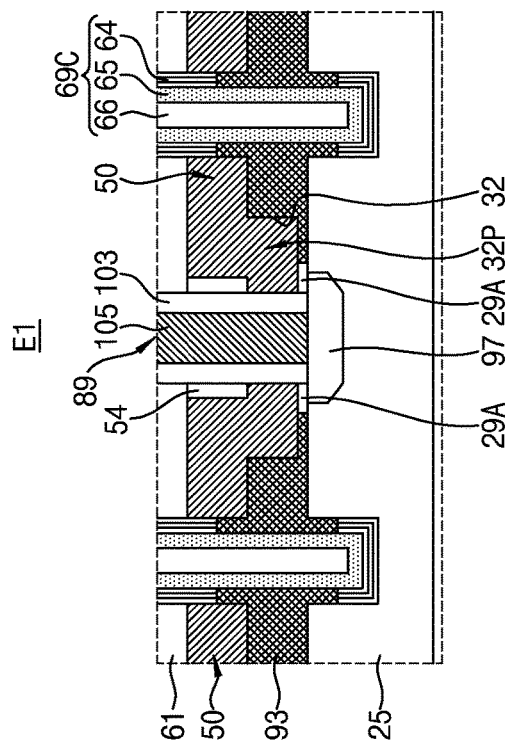
Figure 11:
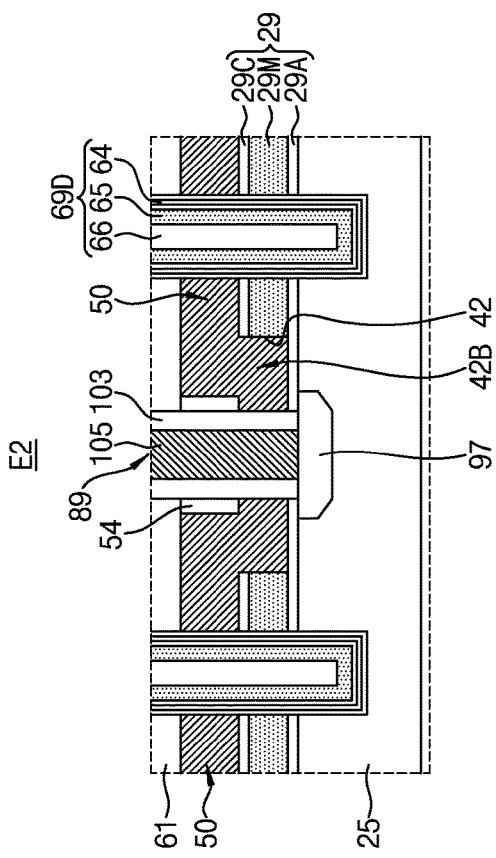

FIG. 1 is a layout for describing a 3D semiconductor device according to an example embodiment of the inventive concepts, and FIGS. 2 and 3 are cross-sectional views for describing the 3D semiconductor device. FIG. 2 is a cross-sectional view taken along lines I-I', II-II', and IV-IV' of FIG. 1, and FIG. 3 is a cross-sectional view taken along line V-V' of FIG. 1. FIGS. 4 and 5 are enlarged views showing a portion E3 of FIG. 2 in detail, FIGS. 6, 8, and 10 are enlarged views showing a portion E1 of FIG. 2 in detail, and FIGS. 7, 9, and 11 are enlarged views showing a portion E2 of FIG. 2 in detail. The 3D semiconductor device according to the example embodiment of the inventive concept may include a non-volatile memory such as a vertical NAND (VNAND) or a 3D flash memory.

Referring to FIG. 1, the 3D semiconductor device according to the example embodiment of the inventive concepts may include a mold layer 29, a plurality of buried trenches 31, 31A, 32, 32A, 33, 41, 42, 43, 44, 45, 46, and 47, support patterns 31P, 31AP, 32P, and 32AP, support bars 33B, 41B, 42B, 43B, 44B, 45B, 46B, and 47B, a plurality of cell channel structures 69C, a plurality of dummy channel structures 69D, a first transistor 81, a second transistor 82, and a plurality of isolation trenches 88, 89, and 90.

The plurality of buried trenches 31, 31A, 32, 32A, 33, 41, 42, 43, 44, 45, 46, and 47 may include a plurality of first cell buried trenches 31, a first strapping buried trench 31A, a plurality of second cell buried trenches 32, a second strapping buried trench 32A, a third cell buried trench 33, a first extension buried trench 41, a second extension buried trench 42, a third extension buried trench 43, a fourth extension buried trench 44, a fifth extension buried trench 45, a sixth extension buried trench 46, and a seventh extension buried trench 47.

The support patterns 31P, 31AP, 32P, and 32AP may include a plurality of first cell support patterns 31P, a first strapping support pattern 31AP, a plurality of second cell support patterns 32P, and a second strapping support pattern 32AP. The support bars 33B, 41B, 42B, 43B, 44B, 45B, 46B, and 47B may include a third cell support bar 33B, a first extension support bar 41B, a second extension support bar 42B, a third extension support bar 43B, a fourth exten-sion support bar 44B, a fifth extension support bar 45B, a sixth extension support bar 46B, and a seventh extension support bar 47B.

The plurality of isolation trenches 88, 89, and 90 may include a first isolation trench 88, a second isolation trench 89, and a third isolation trench 90.

Referring to FIG. 2, the 3D semiconductor device according to the example embodiment of the inventive concepts may include a substrate 21, a first well 23, a second well 24, a lower conductive layer 25, the mold layer 29, the plurality of buried trenches 31, 31A, 32, 32A, 33, 41, 42, and 43, supporters 50, 31P, 32P, 33B, 41B, 42B, and 43B, a device isolation layer 53, a gap filling layer 54, a stack structure 60, the plurality of cell channel structures 69C, the plurality of dummy channel structures 69D, the first transistor 81, the second transistor 82, an etch stop layer 83, a first interlayer insulating layer 85, the plurality of isolation trenches 88, 89, and 90, a second interlayer insulating layer 87, a replacement conductive line 93, an impurity region 97, an insulating spacer 103, a trench buried layer 105, a third interlayer insulating layer 106, a selective line separation pattern 107, a fourth interlayer insulating layer 108, a plurality of sub-bit plugs 113, a plurality of sub-bit lines 115, a fifth interlayer insulating layer 121, a plurality of bit plugs 123, and a bit line 125.

The supporters 50, 31P, 32P, 33B, 41B, 42B, and 43B may include a support plate 50, the support patterns 31P and 32P, and the support bars 33B, 41B, 42B, and 43B. The stack structure 60 may include a plurality of insulating layers 61 and a plurality of conductive layers 95 that are alternately stacked. Each of the plurality of cell channel structures 69C and the plurality of dummy channel structures 69D may include an information storage pattern 64, a channel pattern 65, a core pattern 66, and a first pad 67. The channel pattern 65 may be on (e.g., surround) an outer side of the core pattern 66. The information storage pattern 64 may be on (e.g., surround) an outer side of the channel pattern 65. As illustrated in FIG. 1, the substrate 21 may include a cell region CEL, a pad region EXT which is adjacent (e.g., in continuity with a side surface of) the cell region CEL, and a peripheral region PERI, which is disposed outside the cell region CEL and the pad region EXT.

Referring to FIG. 3, the 3D semiconductor device according to the example embodiment of the inventive concepts may include the substrate 21, the lower conductive layer 25, the mold layer 29, a plurality of buried trenches 41, 42, and 43, the supporters 50, 41B, 42B, and 43B, the stack structure 60, the plurality of dummy channel structures 69D, the first interlayer insulating layer 85, a plurality of isolation trenches 88 and 89, the second interlayer insulating layer 87, the impurity region 97, the insulating spacer 103, the trench buried layer 105, the third interlayer insulating layer 106, the selective line separation pattern 107, the fourth interlayer insulating layer 108, and the fifth interlayer insulating layer 121.

Referring to FIG. 4, each of the plurality of cell channel structures 69C and the plurality of dummy channel structures 69D may include the information storage pattern 64, the channel pattern 65, and the core pattern 66. The information storage pattern 64 may include a tunnel insulating layer 64T, a charge storage layer 64E, a first blocking layer 64B, and a second blocking layer 64B2.

Referring to FIG. 5, in some embodiments, the information storage pattern 64 may include the tunnel insulating layer 64T, the charge storage layer 64E, and the first blocking layer 64B, but the second blocking layer 64B2 may be omitted.

Referring to FIG. 6, the plurality of second cell buried trenches 32 may pass through the replacement conductive line 93. The plurality of second cell support patterns 32P may be formed in the plurality of second cell buried trenches 32. The second isolation trench 89 may pass through the plurality of insulating layers 61, the gap filling layer 54, and the plurality of second cell support patterns 32P. Lower ends of the plurality of second cell support patterns 32P may be in direct contact with the lower conductive layer 25. The plurality of second cell support patterns 32P may be in continuity (e.g., integral) with the support plate 50. The impurity region 97 may be disposed below the second isolation trench 89. The impurity region 97 may be formed in the lower conductive layer 25. The replacement conductive line 93 may pass through the information storage pattern 64 to be in direct contact with a side surface of the channel pattern 65. The replacement conductive line 93 may extend between the support plate 50 and the channel pattern 65 and between the lower conductive layer 25 and the channel pattern 65. Though referenced as a replacement conductive line 93, the term "replacement" is used for identification purposes only and is not intended to require any particular characteristics of the conductive line. The replacement conductive line 93 may also be referred to as a conductive line.

Referring to FIG. 7, the second extension buried trench 42 may pass through the mold layer 29. The second extension support bar 42B may be formed in the second extension buried trench 42. A lower end of the second extension support bar 42B may be in direct contact with the lower conductive layer 25. The mold layer 29 may remain between the lower conductive layer 25 and the support plate 50. The mold layer 29 may include a lower mold layer 29A, an intermediate mold layer 29M, and an upper mold layer 29C.

Referring again to FIGS. 1 to 7, in some embodiments, the lower conductive layer 25 may be disposed inside the substrate 21 or on the substrate 21. The lower conductive layer 25 may be formed in the cell region CEL and the pad region EXT. The replacement conductive line 93 may be disposed on the lower conductive layer 25 in the cell region CEL. The mold layer 29 may be disposed on the lower conductive layer 25 in the pad region EXT. The replacement conductive line 93 may be formed at substantially the same level as the mold layer 29. The plurality of buried trenches 31, 31A, 32, 32A, 33, 41, 42, 43, 44, 45, 46, and 47 may pass through the replacement conductive line 93 and the mold layer 29. The supporters 50, 31P, 32P, 33B, 41B, 42B, 43B, 44B, 45B, 46B, and 47B may be formed on the replacement conductive line 93 and the mold layer 29 and may extend in the plurality of buried trenches 31, 31A, 32, 32A, 33, 41, 42, 43, 44, 45, 46, and 47. Since the supporters 50, 31P, 32P, 33B, 41B, 42B, 43B, 44B, 45B, 46B, and 47B may extend in the plurality of buried trenches 31, 31A, 32, 32A, 33, 41, 42, 43, 44, 45, 46, and 47, they are illustrated in FIG. 1 as being associated with the same designator.

The stack structure 60 in which the plurality of insulating layers 61 and the plurality of conductive layers 95 are alternately stacked may be disposed on the supporters 50, 31P, 32P, 33B, 41B, 42B, 43B, 44B, 45B, 46B, and 47B. The plurality of cell channel structures 69C may pass through the stack structure 60, at least some of the supporters 50, 31P, 32P, 33B, 41B, 42B, 43B, 44B, 45B, 46B, and 47B, and the replacement conductive line 93. The plurality of dummy channel structures 69D may pass through the stack structure 60, at least some of the supporters 50, 31P, 32P, 33B, 41B, 42B, 43B, 44B, 45B, 46B, and 47B, and the mold layer 29. The plurality of isolation trenches 88, 89, and 90 may be disposed to pass through the stack structure 60, the supporters 50, 31P, 32P, 33B, 41B, 42B, 43B, 44B, 45B, 46B, and 47B, the replacement conductive line 93, and the mold layer 29. In some embodiments, each of the plurality of cell channel structures 69C may be interpreted as a channel structure.

The plurality of first cell buried trenches 31, the first strapping buried trench 31A, the plurality of second cell buried trenches 32, the second strapping buried trench 32A, and the third cell buried trench 33 may be formed in the cell region CEL. The first extension buried trench 41, the second extension buried trench 42, the third extension buried trench 43, the fourth extension buried trench 44, the fifth extension buried trench 45, the sixth extension buried trench 46, and the seventh extension buried trench 47 may be formed in the pad region EXT.

The plurality of first cell buried trenches 31 may be spaced apart from each other and aligned (e.g., linearly) with each other in a row direction. The first strapping buried trench 31A may be formed between ones of the plurality of first cell buried trenches 31. A width (e.g., in the row direction) of the first strapping buried trench 31A may be greater than that of each of the plurality of first cell buried trenches 31. The plurality of second cell buried trenches 32 may be spaced apart from and parallel to the plurality of first cell buried trenches 31. The plurality of second cell buried trenches 32 may be spaced apart from each other and aligned (e.g., linearly) with each other in a row direction. The second strapping buried trench 32A may be formed between ones the plurality of second cell buried trenches 32. The third cell buried trench 33 may be formed between the plurality of first cell buried trenches 31 and the plurality of second cell buried trenches 32. In some embodiments, the third cell buried trench 33 may be between and, in some embodiments, centered between, the plurality of first cell buried trenches 31 and the plurality of second cell buried trenches 32. The third cell buried trench 33 may have a bar shape or a groove shape.

Each of the first extension buried trench 41, the second extension buried trench 42, the third extension buried trench 43, the fourth extension buried trench 44, the fifth extension buried trench 45, the sixth extension buried trench 46, and the seventh extension buried trench 47 may have a bar shape or a groove shape. The first extension buried trench 41 may be aligned on the same extension line as the plurality of first cell buried trenches 31 in the row direction. The second extension buried trench 42 may be aligned on the same extension line as the plurality of second cell buried trenches 32 in the row direction. The second extension buried trench 42 may be spaced apart from and parallel to the first extension buried trench 41. The third extension buried trench 43 may be formed between the first extension buried trench 41 and the second extension buried trench 42. In some embodiments, the third extension buried trench 43 may be between and, in some embodiments, centered between, the first extension buried trench 41 and the second extension buried trench 42. The third extension buried trench 43 may be aligned on the same extension line as the third cell buried trench 33 in the row direction. The third extension buried trench 43 may communicate with (e.g., be connected with) the third cell buried trench 33.

The fourth extension buried trench 44 and the fifth extension buried trench 45 may be formed adjacent to a boundary between the cell region CEL and the pad region EXT. The fourth extension buried trench 44 may be formed between the first extension buried trench 41 and the third extension buried trench 43. The fourth extension buried trench 44 may communicate with (e.g., be connected with)

the first extension buried trench 41 and the third extension buried trench 43. The fifth extension buried trench 45 may be formed between the second extension buried trench 42 and the third extension buried trench 43. The fifth extension buried trench 45 may communicate with (e.g., be connected with) the second extension buried trench 42 and the third extension buried trench 43.

The sixth extension buried trench 46 and the seventh extension buried trench 47 may be formed adjacent to an edge of the pad region EXT. In some embodiments, the sixth extension buried trench 46 and the seventh extension buried trench 47 may be formed adjacent to the edge of the pad region EXT that is opposite the boundary between the cell region CEL and the pad region EXT. The sixth extension buried trench 46 and the seventh extension buried trench 47 may be disposed at a relatively far distance from the boundary between the cell region CEL and the pad region EXT. The sixth extension buried trench 46 may be formed between the first extension buried trench 41 and the third extension buried trench 43. The sixth extension buried trench 46 may communicate with (e.g., be connected with) the first extension buried trench 41 and the third extension buried trench 43. The sixth extension buried trench 46 may be opposite the fourth extension buried trench 44. The seventh extension buried trench 47 may be formed between the second extension buried trench 42 and the third extension buried trench 43. The seventh extension buried trench 47 may communicate with (e.g., be connected with) the second extension buried trench 42 and the third extension buried trench 43. The seventh extension buried trench 47 may be opposite the fifth extension buried trench 45.

The plurality of cell channel structures 69C may be disposed between the plurality of first cell buried trenches 31 and the plurality of second cell buried trenches 32. The plurality of dummy channel structures 69D may be disposed between the first extension buried trench 41 and the second extension buried trench 42.

The supporters 50, 31P, 32P, 33B, 41B, 42B, 43B, 44B, 45B, 46B, and 47B may include the support plate 50, the support patterns 31P, 31AP, 32P, and 32AP, and the support bars 33B, 41B, 42B, 43B, 44B, 45B, 46B, and 47B. The support plate 50 may be formed in the cell region CEL and the pad region EXT. The support plate 50 may be disposed on the replacement conductive line 93 and the mold layer 29. The support patterns 31P, 31AP, 32P, and 32AP and the support bars 33B, 41B, 42B, 43B, 44B, 45B, 46B, and 47B may be disposed in the plurality of buried trenches 31, 31A, 32, 32A, 33, 41, 42, 43, 44, 45, 46, and 47 and may be in continuity (e.g., integral) with the support plate 50.

The plurality of isolation trenches 88, 89, and 90 may pass through the supporters 50, 31P, 32P, 33B, 41B, 42B, 43B, 44B, 45B, 46B, and 47B. The plurality of isolation trenches 88, 89, and 90 may pass through the support plate 50, the support patterns 31P, 31AP, 32P, and 32AP, and at least some of the support bars 33B; 41B, 42B, 43B, 44B, 45B, 46B, and 47B.

The support patterns 31P, 31AP, 32P, and 32AP and the support bars 33B, 41B, 42B, 43B, 44B, 45B, 46B, and 47B may include a material identical to the support plate 50. For example, the support plate 50, the support patterns 31P, 31AP, 32P, and 32AP, and the support bars 33B, 41B, 42B, 43B, 44B, 45B, 46B, and 47B may include polysilicon. Lower ends of the support patterns 31P, 31AP, 32P, and 32AP and the support bars 33B, 41B, 42B, 43B, 44B, 45B, 46B, and 47B may be in direct contact with the lower conductive layer 25. The replacement conductive line 93 may be in direct contact with the lower conductive layer 25 and the support plate 50. The replacement conductive line 93 may pass through the information storage pattern 64 to be in direct contact with the side surface of the channel pattern 65.

The plurality of first cell support patterns 31P, the first strapping support pattern 31AP, the plurality of second cell support patterns 32P, and the second strapping support pattern 32AP may be respectively disposed in the plurality of first cell buried trenches 31, the first strapping buried trench 31A, the plurality of second cell buried trenches 32, and the second strapping buried trench 32A. The third cell support bar 33B, the first extension support bar 41B, the second extension support bar 42B, the third extension support bar 43B, the fourth extension support bar 44B, the fifth extension support bar 45B, the sixth extension support bar 46B, and the seventh extension support bar 47B may be respectively disposed in the third cell buried trench 33, the first extension buried trench 41, the second extension buried trench 42, the third extension buried trench 43, the fourth extension buried trench 44, the fifth extension buried trench 45, the sixth extension buried trench 46, and the seventh extension buried trench 47.

The first isolation trench 88 may pass through the plurality of first cell support patterns 31P, the first strapping support pattern 31AP, and the first extension support bar 41B. The second isolation trench 89 may pass through the plurality of second cell support patterns 32P, the second strapping support pattern 32AP, and the second extension support bar 42B. The third isolation trench 90 may pass through a portion of the third extension support bar 43B.

Referring to FIG. 8, in some embodiments, the lower mold layer 29A may partially remain between the plurality of second cell support patterns 32P and the lower conductive layer 25. The replacement conductive line 93 may extend between the plurality of second cell support patterns 32P and the lower conductive layer 25. The insulating spacer 103 may extend between the plurality of second cell support patterns 32P and the lower conductive layer 25. The lower mold layer 29A may be interposed between the insulating spacer 103 and the replacement conductive line 93.

Referring to FIG. 9, in some embodiments, the lower mold layer 29A may extend between the second extension support bar 42B and the lower conductive layer 25. The insulating spacer 103 may extend between the second extension support bar 42B and the lower conductive layer 25.

Referring to FIG. 10, in some embodiments, the lower mold layer 29A may partially remain between the plurality of second cell support patterns 32P and the lower conductive layer 25. The replacement conductive line 93 may extend between the plurality of second cell support patterns 32P and the lower conductive layer 25.

Referring to FIG. 11, in some embodiments, the lower mold layer 29A may extend between the second extension support bar 42B and the lower conductive layer 25.

In some embodiments, similar to FIGS. 8 to 11, the lower mold layer 29A may partially remain between the support patterns 31P, 31AP, 32P, and 32AP and the lower conductive layer 25 and between the support bars 33B, 41B, 42B, 43B, 44B, 45B, 46B, and 47B and the lower conductive layer 25.

Figure 12:
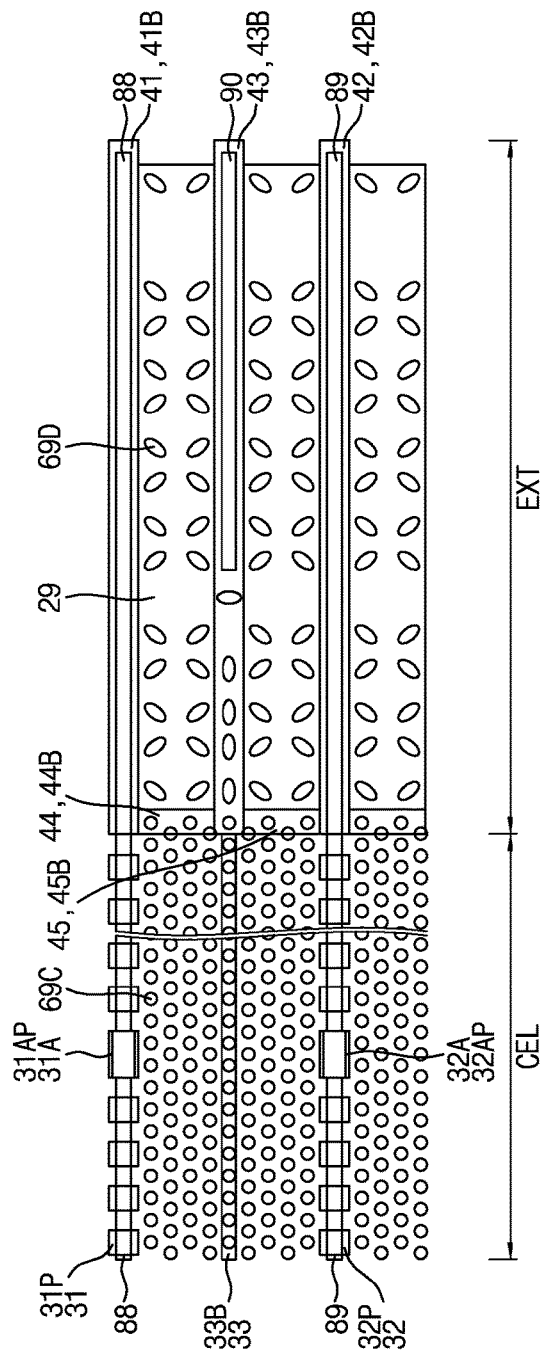
Figure 15:
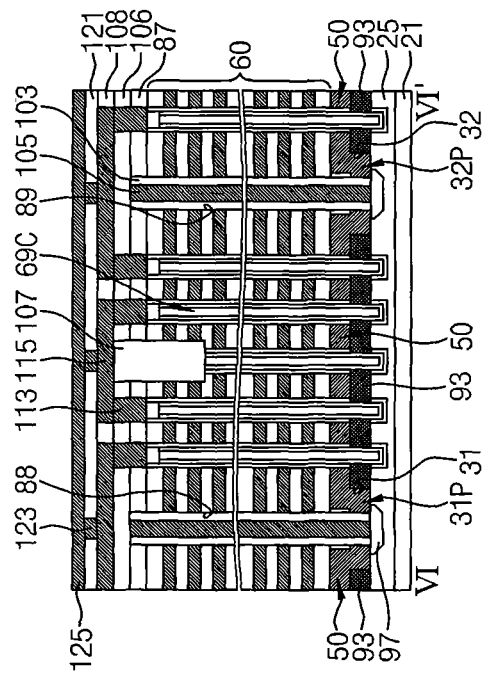

FIGS. 12 to 14 are layouts for describing 3D semiconductor devices according to example embodiments, and FIG. 15 is a cross-sectional view taken along line VI-VI' of FIG. 14.

Referring to FIG. 12, a 3D semiconductor device according to example embodiments of the inventive concepts may include a mold layer 29, a plurality of buried trenches 31, 31A, 32, 32A, 33, 41, 42, 43, 44, and 45, support patterns 31P, 31AP, 32P, and 32AP, support bars 33B, 41B, 42B, 43B, 44B, and 45B, a plurality of cell channel structures 69C, a plurality of dummy channel structures 69D, and a plurality of isolation trenches 88, 89, and 90.

The plurality of buried trenches 31, 31A, 32, 32A, 33, 41, 42, 43, 44, and 45 may include a plurality of first cell buried trenches 31, a first strapping buried trench 31A, a plurality of second cell buried trenches 32, a second strapping buried trench 32A, a third cell buried trench 33, a first extension buried trench 41, a second extension buried trench 42, a third extension buried trench 43, a fourth extension buried trench 44, and a fifth extension buried trench 45. The support bars 33B, 41B, 42B, 43B, 44B, and 45B may include a third cell support bar 33B, a first extension support bar 41B, a second extension support bar 42B, a third extension support bar 43B, a fourth extension support bar 44B, and a fifth extension support bar 45B. As illustrated in FIG. 12, the embodiment of FIG. 12 may not include at least the sixth extension buried trench 46, the seventh extension buried trench 47, the sixth extension support bar 46B, and the seventh extension support bar 47B illustrated in FIG. 1.

Referring to FIG. 13, a 3D semiconductor device according to example embodiments of the inventive concepts may include a mold layer 29, a plurality of buried trenches 31, 31A, 32, 32A, 33, 41, 42, and 43, support patterns 31P, 31AP, 32P, and 32AP, support bars 33B, 41B, 42B, and 43B, a plurality of cell channel structures 69C, a plurality of dummy channel structures 69D, and a plurality of isolation trenches 88, 89, and 90.

The plurality of buried trenches 31, 31A, 32, 32A, 33, 41, 42, and 43 may include a plurality of first cell buried trenches 31, a first strapping buried trench 31A, a plurality of second cell buried trenches 32, a second strapping buried trench 32A, a third cell buried trench 33, a first extension buried trench 41, a second extension buried trench 42, and a third extension buried trench 43. The support bars 33B, 41B, 42B, and 43B may include a third cell support bar 33B, a first extension support bar 41B, a second extension support bar 42B, and a third extension support bar 43B. As illustrated in FIG. 13, the embodiment of FIG. 13 may not include at least the fourth extension buried trench 44, the fifth extension buried trench 45, the fourth extension support bar 44B, and the fifth extension support bar 45B illustrated in FIG. 12.

Referring to FIGS. 14 and 15, a 3D semiconductor device according to example embodiments of the inventive concepts may include a mold layer 29, a plurality of buried trenches 31, 31A, 32, 32A, 41, 42, 43, 44, 45, 46, and 47, support patterns 31P, 31AF', 32P, and 32AP, support bars 41B, 42B, 43B, 44B, 45B, 46B, and 47B, a plurality of cell channel structures 69C, a plurality of dummy channel structures 69D, and a plurality of isolation trenches 88, 89, and 90.

The plurality of buried trenches 31, 31A, 32, 32A, 41, 42, 43, 44, 45, 46, and 47 may include a plurality of first cell buried trenches 31, a first strapping buried trench 31A, a plurality of second cell buried trenches 32, a second strapping buried trench 32A, a first extension buried trench 41, a second extension buried trench 42, a third extension buried trench 43, a fourth extension buried trench 44, a fifth extension buried trench 45, a sixth extension buried trench 46, and a seventh extension buried trench 47.

The support patterns 31P, 31AP, 32P, and 32AP may include a plurality of first cell support patterns 31P, a first strapping support pattern 31AP, a plurality of second cell support patterns 32P, and a second strapping support pattern 32AP. The support bars 41B, 42B, 43B, 44B, 45B, 46B, and 47B may include a first extension support bar 41B, a second extension support bar 42B, a third extension support bar 43B, a fourth extension support bar 44B, a fifth extension support bar 45B, a sixth extension support bar 46B, and a seventh extension support bar 47B. As illustrated in FIGS. 14 and 15, the embodiment of FIGS. 14 and 15 may not include at least the third cell buried trench 33 and the third cell support bar 33B illustrated in FIGS. 1 and 2.

Figure 16:
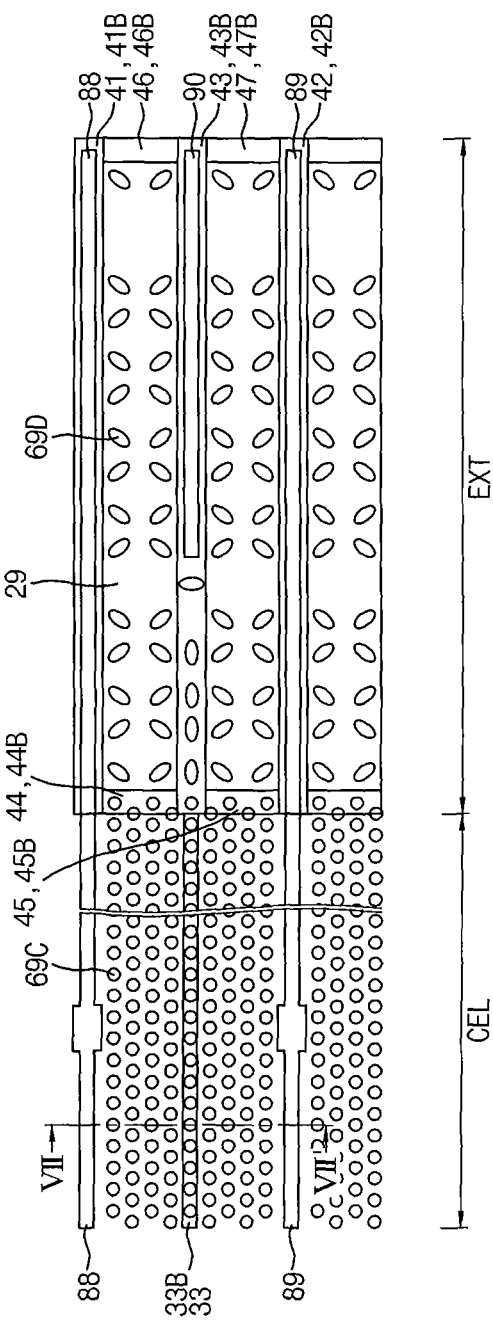

FIG. 16 is a layout for describing a 3D semiconductor device according to example embodiments, and FIG. 17 is a cross-sectional view taken along line VII-VII' of FIG. 16.

Referring to FIGS. 16 and 17, the 3D semiconductor device according to example embodiments of the inventive concepts may include a mold layer 29, a plurality of buried trenches 33, 41, 42, 43, 44, 45, 46, and 47, support bars 33B, 41B, 42B, 43B, 44B, 45B, 46B, and 47B, a plurality of cell channel structures 69C, a plurality of dummy channel structures 69D, and a plurality of isolation trenches 88, 89, and 90.

The plurality of buried trenches 33, 41, 42, 43, 44, 45, 46, and 47 may include a third cell buried trench 33, a first extension buried trench 41, a second extension buried trench 42, a third extension buried trench 43, a fourth extension buried trench 44, a fifth extension buried trench 45, a sixth extension buried trench 46, and a seventh extension buried trench 47. In some embodiments, the third cell buried trench 33 may be referred to as a cell buried trench.

The support bars 33B, 41B, 42B, 43B, 44B, 45B, 46B, and 47B may include a third cell support bar 33B, a first extension support bar 41B, a second extension support bar 42B, a third extension support bar 43B, a fourth extension support bar 44B, a fifth extension support bar 45B, a sixth extension support bar 46B, and a seventh extension support bar 47B. As illustrated in FIGS. 16 and 17, the embodiment of FIGS. 16 and 17 may not include at least the plurality of first cell buried trenches 31, the first strapping buried trench 31A, the plurality of second cell buried trenches 32, the second strapping buried trench 32A, the plurality of first cell support patterns 31P, the first strapping support pattern 31AP, the plurality of second cell support patterns 32P, and the second strapping support pattern 32AP illustrated in FIGS. 1 and 2.

Figure 19:
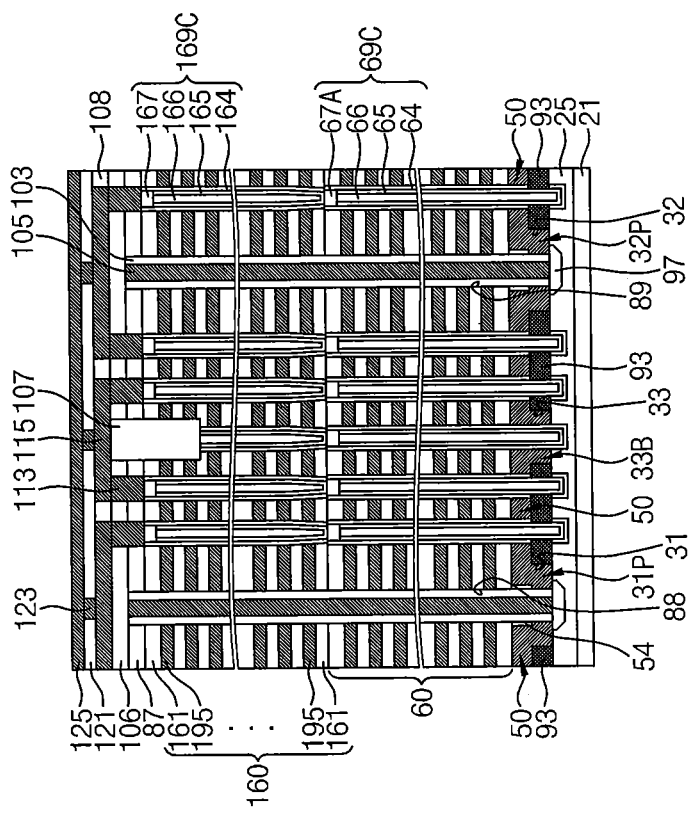

FIG. 18 is a layout for describing a 3D semiconductor device according to example embodiments, and FIG. 19 is a cross-sectional view taken along line VIII-VIII' of FIG. 18.

Referring to FIGS. 18 and 19, the 3D semiconductor device according to example embodiments of the inventive concepts may include a mold layer 29, a plurality of buried trenches 41, 42, 43, 44, 45, 46, and 47, support bars 41B, 42B, 43B, 44B, 45B, 46B, and 47B, a plurality of cell channel structures 69C, a plurality of dummy channel structures 69D, and a plurality of isolation trenches 88, 89, and 90.

The plurality of buried trenches 41, 42, 43, 44, 45, 46, and 47 may include a first extension buried trench 41, a second extension buried trench 42, a third extension buried trench 43, a fourth extension buried trench 44, a fifth extension buried trench 45, a sixth extension buried trench 46, and a seventh extension buried trench 47. The support bars 41B, 42B, 43B, 44B, 45B, 46B, and 47B may include a first extension support bar 41B, a second extension support bar 42B, a third extension support bar 43B, a fourth extension support bar 44B, a fifth extension support bar 45B, a sixth extension support bar 46B, and a seventh extension support bar 47B. As illustrated in FIGS. 18 and 19, the embodiment of FIGS. 18 and 19 may not include at least the plurality of first cell buried trenches 31, the first strapping buried trench 31A, the plurality of second cell buried trenches 32, the second strapping buried trench 32A, the third cell buried trench 33, the plurality of first cell support patterns 31P, the first strapping support pattern 31AP, the plurality of second cell support patterns 32P, the second strapping support pattern 32AP, and the third cell support bar 33B illustrated in FIGS. 1 and 2.

Figure 20:
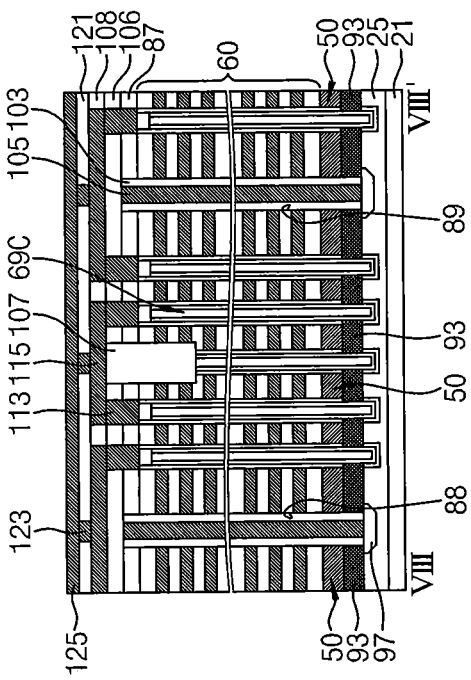
Figure 21:
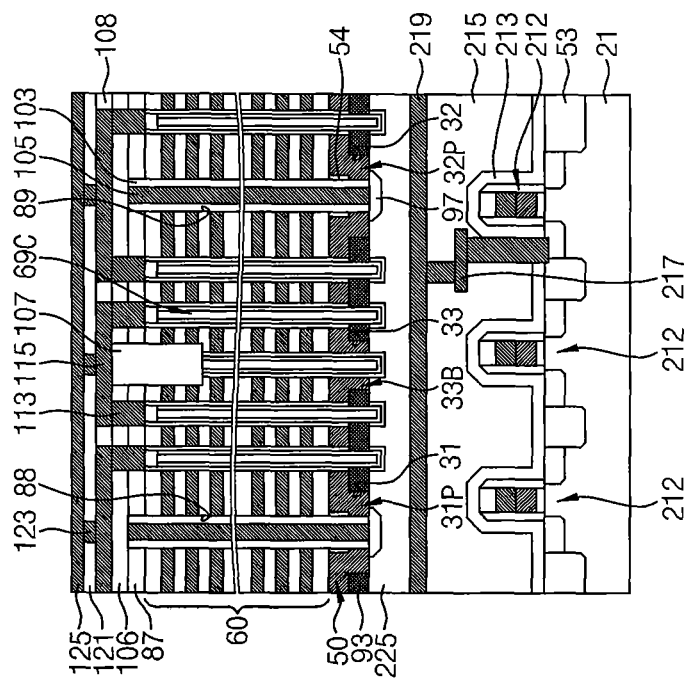
Figure 22:
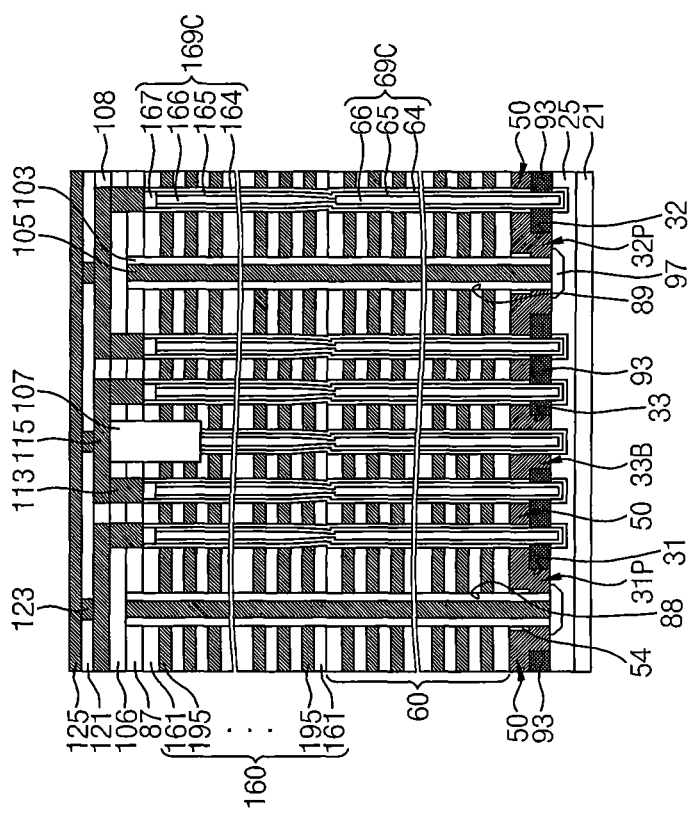

FIGS. 20 to 22 are cross-sectional views for describing 3D semiconductor devices according to example embodiments of the inventive concepts.

Referring to FIG. 20, a 3D semiconductor device according to an example embodiment of the inventive concepts may include a substrate 21, a lower conductive layer 25, a plurality of buried trenches 31, 32, and 33, supporters 50, 31P, 32P, and 33B, a gap filling layer 54, a first stack structure 60, a second stack structure 160, a plurality of first cell channel structures 69C, a plurality of second cell channel structures 169C, a plurality of isolation trenches 88 and 89, a second interlayer insulating layer 87, a replacement conductive line 93, an impurity region 97, an insulating spacer 103, a trench buried layer 105, a third interlayer insulating layer 106, a selective line separation pattern 107, a fourth interlayer insulating layer 108, a plurality of sub-bit plugs 113, a plurality of sub-bit lines 115, a fifth interlayer insulating layer 121, a plurality of bit plugs 123, and a bit line 125. The 3D semiconductor device according to the example embodiment of the inventive concepts may be interpreted as including a double-stack structure.

The second stack structure 160 may include a plurality of second insulating layers 161 and a plurality of second conductive layers 195 which are alternately stacked. The plurality of first cell channel structures 69C may include a first information storage pattern 64, a first channel pattern 65, a first core pattern 66, and a first pad 67A. The plurality of second cell channel structures 169C may include a second information storage pattern 164, a second channel pattern 165, a second core pattern 166, and a second pad 167. The second channel pattern 165 may be connected to the first channel pattern 65 via the first pad 67A. In some embodiments, the first pad 67A may be omitted.

Referring to FIG. 21, a plurality of first cell channel structures 69C may include a first information storage pattern 64, a first channel pattern 65, and a first core pattern 66. The plurality of second cell channel structures 169C may include a second information storage pattern 164, a second channel pattern 165, a second core pattern 166, and a second pad 167. The second channel pattern 165 may be connected to the first channel pattern 65. The second core pattern 166 may be connected to the first core pattern 66.

Referring to FIG. 22, a 3D semiconductor device according to an example embodiment of the inventive concepts may include a substrate 21, a peripheral interlayer interconnection 217, a peripheral circuit interconnection 219, a lower conductive layer 225, a plurality of buried trenches 31, 32, and 33, supporters 50, 31P, 32P, and 33B, a device isolation layer 53, a gap filling layer 54, a stack structure 60, a plurality of cell channel structures 69C, a plurality of transistors 212, an etch stop layer 213, a lower interlayer insulating layer 215, a plurality of isolation trenches 88 and 89, a second interlayer insulating layer 87, a replacement conductive line 93, an impurity region 97, an insulating spacer 103, a trench buried layer 105, a third interlayer insulating layer 106, a selective line separation pattern 107, a fourth interlayer insulating layer 108, a plurality of sub-bit plugs 113, a plurality of sub-bit lines 115, a fifth interlayer insulating layer 121, a plurality of bit plugs 123, and a bit line 125. The supporters 50, 31P, 32P, and 33B may include a support plate 50, support patterns 31P and 32P, and a support bar 33B. The 3D semiconductor device according to the example embodiment of the inventive concepts may be interpreted as including a cell-on-peripheral (COP) structure.

In some embodiments, the trench buried layer 105 may include an insulating layer. The replacement conductive line 93 may be electrically connected to the peripheral circuit interconnection 219 via the lower conductive layer 225. The lower conductive layer 225 may include a plurality of semiconductor layers having different conductivity types.

Figure 37:
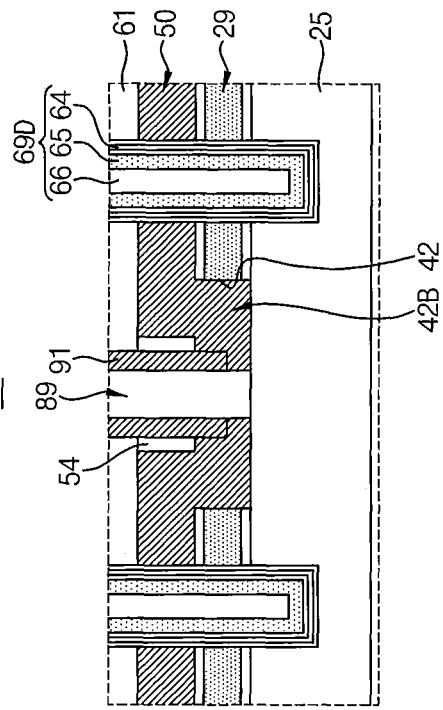
FIGS. 36 to 41 are enlarged views showing a portion of FIG. 35 in detail.
Figure 38:
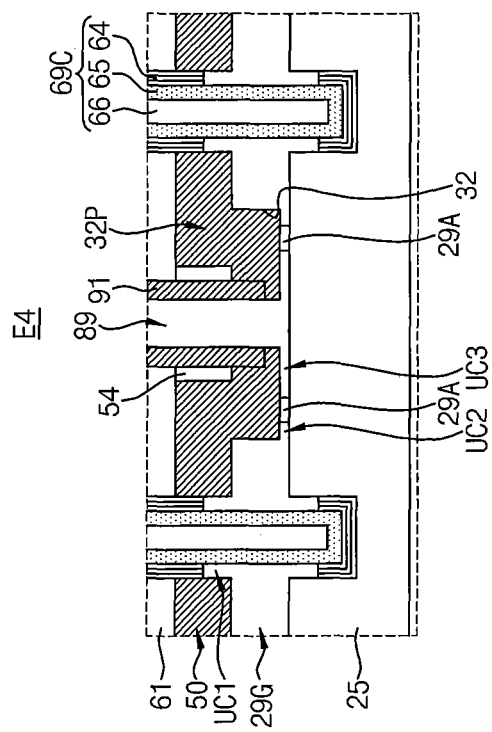
Figure 39:
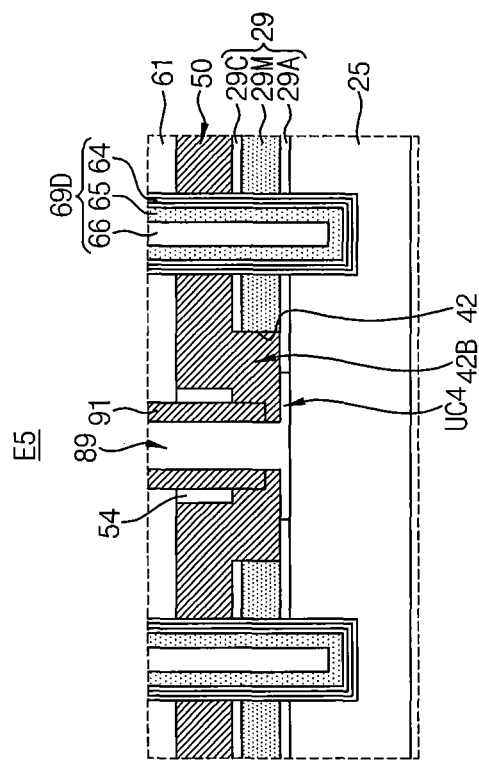
Figure 40:
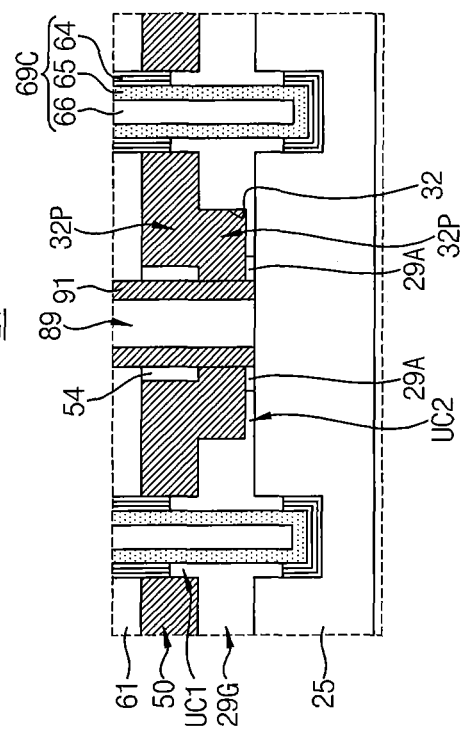
Figure 41:
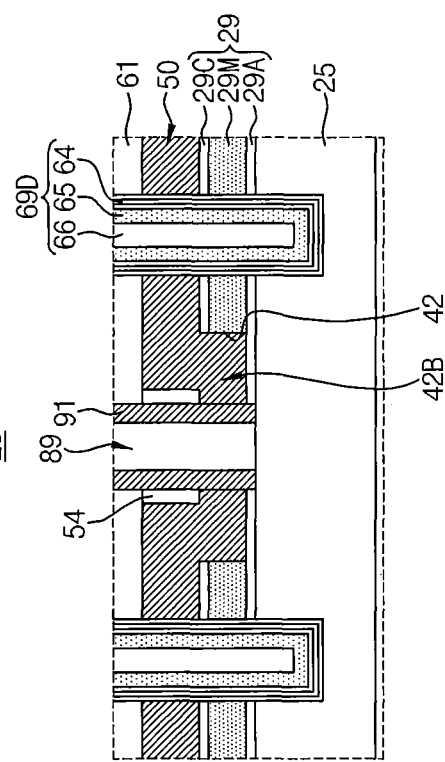

FIGS. 23 to 25, 28 to 35, and 42 to 46 are cross-sectional views for describing a method of forming a 3D semiconductor device according to embodiments of the inventive concepts. FIGS. 26 and 27 are enlarged views showing a portion of FIG. 25 in detail, FIGS. 36, 38, and 40 are enlarged views showing a portion E4 of FIG. 35 in detail, and FIGS. 37, 39, and 41 are enlarged views showing a portion E5 of FIG. 35 in detail. FIGS. 23 to 25, 28 to 35, and 42 to 46 are cross-sectional views taken along lines I-I', II-II', III-III', and IV-IV' of FIG. 1.

Figure 23:
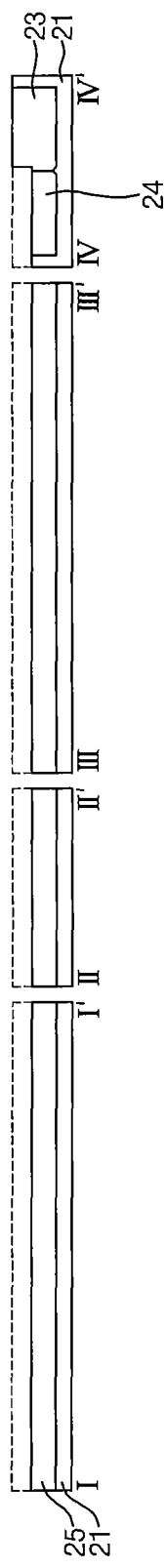
FIGS. 23 to 25, 28 to 35, and 42 to 46 are cross-sectional views for describing a method of forming a 3D semiconductor device according to an example embodiment of the inventive concepts.

Referring to FIGS. 1 and 23, a first well 23, a second well 24, and a lower conductive layer 25 may be formed in a predetermined region in a substrate 21. Upper surfaces of the second well 24 and the lower conductive layer 25 may be etched to be recessed downward.

The substrate 21 may include a semiconductor substrate such as a silicon wafer or a silicon-on-insulator (SOI) wafer. For example, the substrate 21 may be a P-type single crystalline silicon wafer. The first well 23, the second well 24, and the lower conductive layer 25 may be a P-type or N-type conductivity type. The second well 24 may be the same conductivity type as the first well 23 or a conductivity type different from that of the first well 23. The lower conductive layer 25 may be the same conductivity type as the first well 23 or the second well 24 which may be simultaneously formed with the lower conductive layer 25. For example, the lower conductive layer 25 may include P-type single crystalline silicon.

The substrate 21 may include a cell region CEL, a pad region EXT which is adjacent (e.g., in continuity with) a side surface of the cell region CEL, and a peripheral region PERI, which is disposed outside the cell region CEL and the pad region EXT. The lower conductive layer 25 may be formed in the cell region CEL and the pad region EXT. In some embodiments, the lower conductive layer 25 may be defined to be on (e.g., cover) the substrate 21 in the cell region CEL and the pad region EXT. In some embodiments, the lower conductive layer 25 may include a semiconductor layer such as polysilicon. The first well 23 and the second well 24 may be formed in the peripheral region PERI. The process of etching the upper surfaces of the second well 24 and the lower conductive layer 25 may include a buffer layer forming process and a patterning process, but the buffer layer forming process and the patterning process will be omitted for the sake of brevity. The upper surfaces of the second well 24 and the lower conductive layer 25 may be formed at a lower level than an upper surface of the first well 23.

Figure 24:
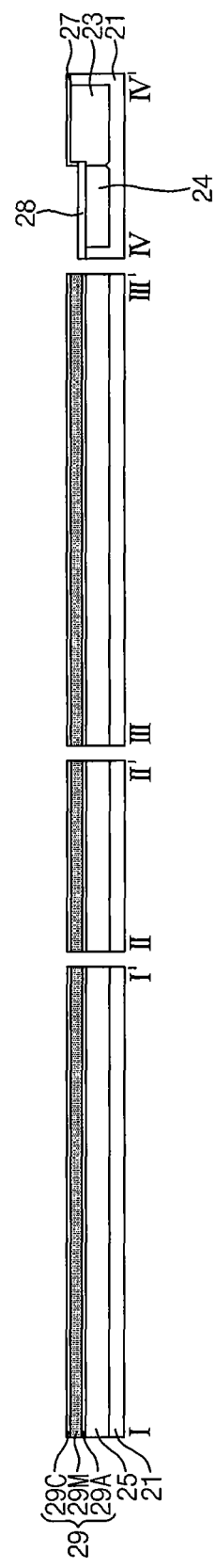

Referring to FIGS. 1 and 24, a first gate dielectric layer 27, a second gate dielectric layer 28, and a mold layer 29 may be formed. The mold layer 29 may include a lower mold layer 29A, an intermediate mold layer 29M, and an upper mold layer 29C which are sequentially stacked.

The mold layer 29 may be formed to be on and, in some embodiments, cover, the lower conductive layer 25 in the cell region CEL and the pad region EXT. The mold layer 29 may include, for example, an oxide, a nitride, a semiconductor, or a combination thereof. The mold layer 29 may include a material having an etch selectivity with respect to the lower conductive layer 25. The intermediate mold layer 29M may include a material having an etch selectivity with respect to the lower conductive layer 25, the lower mold layer 29A, and the upper mold layer 29C. For example, the lower mold layer 29A may include silicon oxide, the intermediate mold layer 29M may include silicon nitride, and the upper mold layer 29C may include silicon oxide. The intermediate mold layer 29M may be thicker than the lower mold layer 29A or the upper mold layer 29C.

The first gate dielectric layer 27 may be formed on the first well 23, and the second gate dielectric layer 28 may be formed on the second well 24. The second gate dielectric layer 28 may be thicker than the first gate dielectric layer 27. In some embodiments, the first gate dielectric layer 27 may include a material layer identical to a material layer having substantially the same thickness as the lower mold layer 29A or the upper mold layer 29C which may be simultaneously formed with the first gate dielectric layer 27. The second gate dielectric layer 28 may include, for example, silicon oxide, silicon nitride, silicon oxynitride, a high-K dielectric, or a combination thereof.

Figure 25:
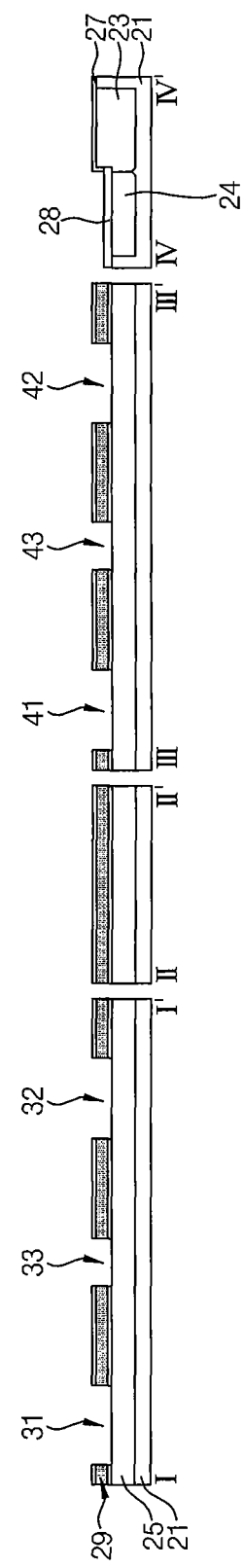

Referring to FIGS. 1 and 25, the mold layer 29 may be patterned so that a plurality of buried trenches 31, 31A, 32, 32A, 33, 41, 42, 43, 44, 45, 46, and 47 may be formed. The plurality of buried trenches 31, 31A, 32, 32A, 33, 41, 42, 43, 44, 45, 46, and 47 may include a plurality of first cell buried trenches 31, a first strapping buried trench 31A, a plurality of second cell buried trenches 32, a second strapping buried trench 32A, a third cell buried trench 33, a first extension buried trench 41, a second extension buried trench 42, a third extension buried trench 43, a fourth extension buried trench 44, a fifth extension buried trench 45, a sixth extension buried trench 46, and a seventh extension buried trench 47.

Referring to FIG. 26, each of the plurality of buried trenches 31, 31A, 32, 32A, 33, 41, 42, 43, 44, 45, 46, and 47 may entirely pass through the mold layer 29. An upper surface of the lower conductive layer 25 may be exposed at bottoms of the plurality of buried trenches 31, 31A, 32, 32A, 33, 41, 42, 43, 44, 45, 46, and 47. FIG. 26 illustrates an example of one of the first cell buried trenches 31. For example, each of the plurality of first cell buried trenches 31 may pass through the upper mold layer 29C, the intermediate mold layer 29M, and the lower mold layer 29A, and the upper surface of the lower conductive layer 25 may be exposed at the bottoms of the plurality of first cell buried trenches 31.

Referring to FIG. 27, each of the plurality of buried trenches 31, 31A, 32, 32A, 33, 41, 42, 43, 44, 45, 46, and 47 may partially pass through the mold layer 29. In some embodiments, an upper surface of the lower mold layer 29A may be exposed at the bottoms of the plurality of buried trenches 31, 31A, 32, 32A, 33, 41, 42, 43, 44, 45, 46, and 47. FIG. 27 illustrates an example of one of the first cell buried trenches 31. For example, each of the plurality of first cell buried trenches 31 may pass through the upper mold layer 29C and the intermediate mold layer 29M, and the upper surface of the lower mold layer 29A may be exposed at the bottoms of the plurality of first cell buried trenches 31.

Figure 28:
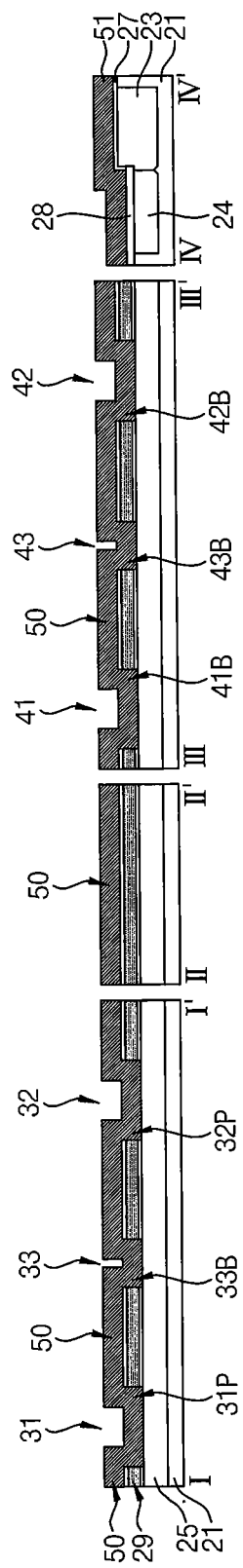

Referring to FIGS. 1 and 28, supporters 50, 31P, 31AP, 32P, 32AP, 33B, 41B, 42B, 43B, 44B, 45B, 46B, and 47B may be formed in the cell region CEL and the pad region EXT, and a peripheral gate electrode layer 51 may be formed in the peripheral region PERI.

The supporters 50, 31P, 31AP, 32P, 32AP, 33B, 41B, 42B, 43B, 44B, 45B, 46B, and 47B may include a material having an etch selectivity with respect to the mold layer 29. For example, the supporters 50, 31P, 31AP, 32P, 32AP, 33B, 41B, 42B, 43B, 44B, 45B, 46B, and 47B may include polysilicon. The peripheral gate electrode layer 51 may include a material identical to a material of the supporters 50, 31P, 31AP, 32P, 32AP, 33B, 41B, 42B, 43B, 44B, 45B, 46B, and 47B which may be simultaneously formed with the peripheral gate electrode layer 51. The peripheral gate electrode layer 51 may be formed on the first gate dielectric layer 27 and the second gate dielectric layer 28.

The supporters 50, 31P, 31AP, 32P, 32AP, 33B, 41B, 42B, 43B, 44B, 45B, 46B, and 47B may include a support plate 50, support patterns 31P, 31AP, 32P, and 32AP, and support bars 33B, 41B, 42B, 43B, 44B, 45B, 46B, and 47B. The support plate 50 may be on and, in some embodiments, cover, the mold layer 29 in the cell region CEL and the pad region EXT. The support patterns 31P, 31AP, 32P, and 32AP and the support bars 33B, 41B, 42B, 43B, 44B, 45B, 46B, and 47B may be in continuity (e.g., integral) with a side surface of the support plate 50. The support patterns 31P, 31AP, 32P, and 32AP and the support bars 33B, 41B, 42B, 43B, 44B, 45B, 46B, and 47B may be formed in the plurality of buried trenches 31, 31A, 32, 32A, 33, 41, 42, 43, 44, 45, 46, and 47. The support patterns 31P, 31AP, 32P, and 32AP and the support bars 33B, 41B, 42B, 43B, 44B, 45B, 46B, and 47B may be in direct contact with bottoms and sidewalls of the plurality of buried trenches 31, 31A, 32, 32A, 33, 41, 42, 43, 44, 45, 46, and 47. In some embodiments, the support patterns 31P, 31AP, 32P, and 32AP and the support bars 33B, 41B, 42B, 43B, 44B, 45B, 46B, and 47B may be in direct contact with the upper surface of the lower conductive layer 25. In some embodiments, the support patterns 31P, 31AP, 32P, and 32AP and the support bars 33B, 41B, 42B, 43B, 44B, 45B, 46B, and 47B may be in direct contact with the upper surface of the lower mold layer 29A.

The support patterns 31P, 31AP, 32P, and 32AP may include a plurality of first cell support patterns 31P formed in the plurality of first cell buried trenches 31, a first strapping support pattern 31AP formed in the first strapping buried trench 31A, a plurality of second cell support patterns 32P formed in the plurality of second cell buried trenches 32, and a second strapping support pattern 32AP formed in the second strapping buried trench 32A. The support bars 33B, 41B, 42B, 43B, 44B, 45B, 46B, and 47B may include a third cell support bar 33B formed in the third cell buried trench 33, a first extension support bar 41B formed in the first extension buried trench 41, a second extension support bar 42B formed in the second extension buried trench 42, a third extension support bar 43B formed in the third extension buried trench 43, a fourth extension support bar 44B formed in the fourth extension buried trench 44, a fifth extension support bar 45B formed in the fifth extension buried trench 45, a sixth extension support bar 46B formed in the sixth extension buried trench 46, and a seventh extension support bar 47B formed in the seventh extension buried trench 47.

Figure 29:
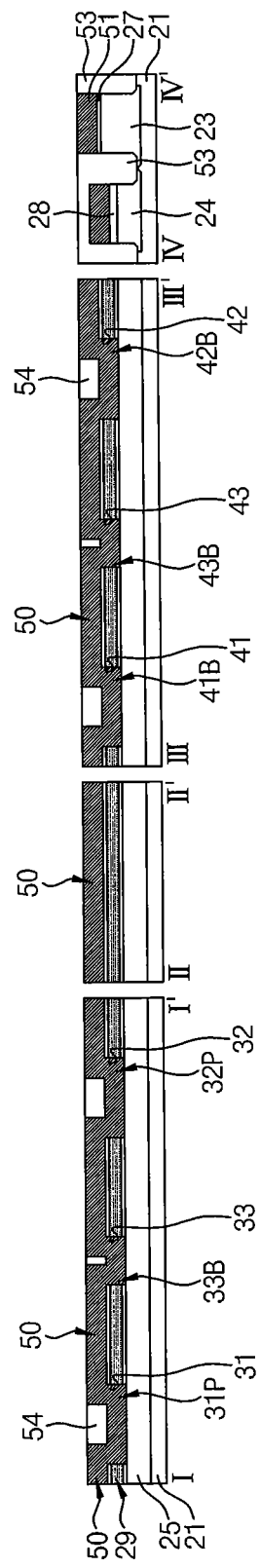

Referring to FIGS. 1 and 29, a device isolation layer 53 may be formed in the peripheral region PERI, and a gap filling layer 54 which may fill the plurality of buried trenches 31, 31A, 32, 32A, 33, 41, 42, 43, 44, 45, 46, and 47 may be formed on the supporters 50, 31P, 31AP, 32P, 32AP, 33B, 41B, 42B, 43B, 44B, 45B, 46B, and 47B. Each of the device isolation layer 53 and the gap filling layer 54 may include an insulating material such as, for example, silicon oxide, silicon nitride, silicon oxynitride, or a combination thereof. Upper surfaces of the gap filling layer 54 and the support plate 50 may be exposed at substantially the same surface.

Figure 30:
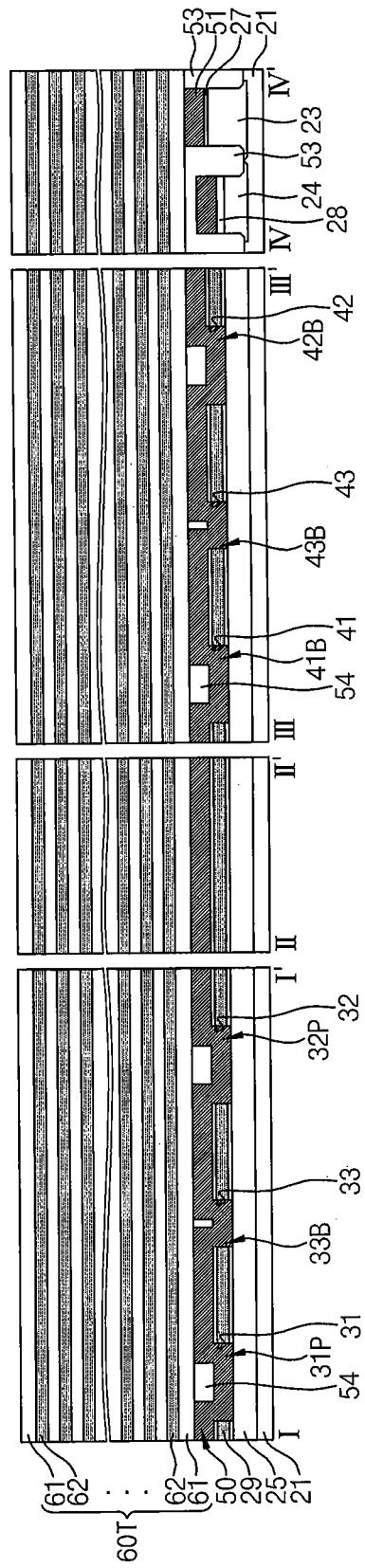

Referring to FIGS. 1 and 30, a preliminary stack structure 60T in which a plurality of insulating layers 61 and a plurality of sacrificial layers 62 are alternately stacked may be formed on the supporters 50, 31P, 31AP, 32P, 32AP, 33B, 41B, 42B, 43B, 44B, 45B, 46B, and 47B and the gap filling layer 54. The plurality of sacrificial layers 62 may include a material having an etch selectivity with respect to the plurality of insulating layers 61. For example, the plurality of insulating layers 61 may include an oxide such as silicon oxide, and the plurality of sacrificial layers 62 may include a nitride such as silicon nitride. A lowermost layer of the preliminary stack structure 60T may be a lowermost layer of the plurality of insulating layers 61, and an uppermost layer of the preliminary stack structure 60T may be an uppermost layer of the plurality of insulating layers 61. The preliminary stack structure 60T may extend into the peripheral region PERI.

Figure 31:
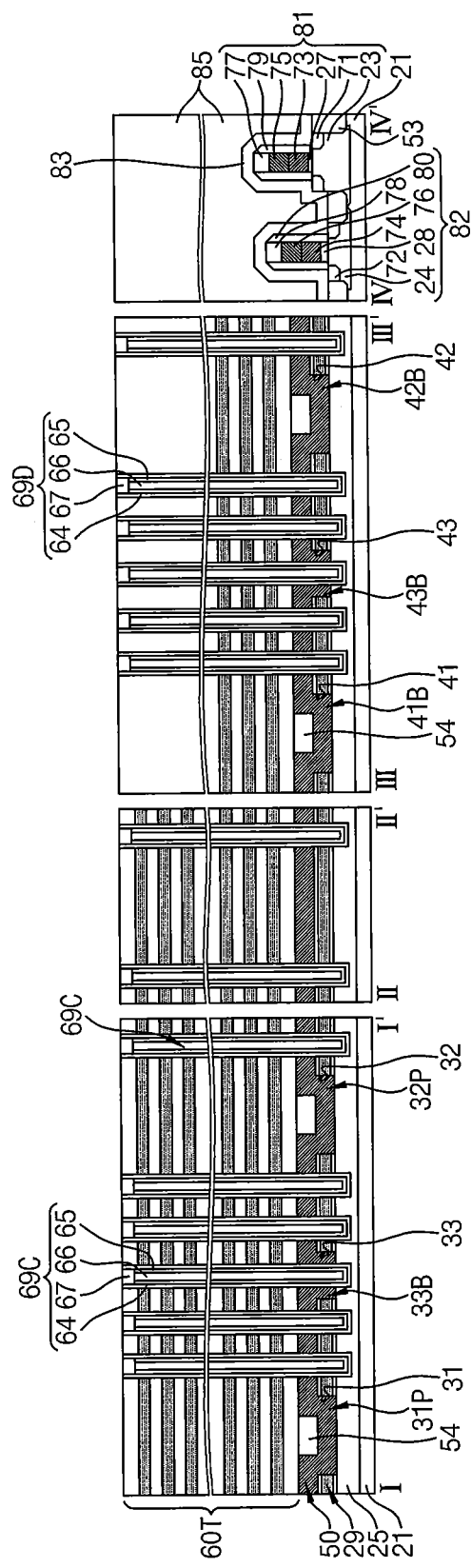

Referring to FIGS. 1 and 31, the preliminary stack structure 60T in the pad region EXT may be partially recessed using a patterning process. While the preliminary stack structure 60T in the pad region EXT is partially recessed, the preliminary stack structure 60T in the peripheral region PERI may be entirely removed. First source/drain regions 71, second source/drain regions 72, a first lower gate electrode 73, a second lower gate electrode 74, a first upper gate electrode 75, a second upper gate electrode 76, a first capping pattern 77, a second capping pattern 78, a first gate spacer 79, a second gate spacer 80, and an etch stop layer 83 may be formed in the peripheral region PERI. The first gate dielectric layer 27 may remain between the first well 23 and the first lower gate electrode 73. The second gate dielectric layer 28 may remain between the second well 24 and the second lower gate electrode 74.

A first interlayer insulating layer 85 may be formed on the etch stop layer 83 and the preliminary stack structure 60T. The first interlayer insulating layer 85 may include an oxide such as, for example, silicon oxide. The process of forming the first interlayer insulating layer 85 may include a thin film forming process and a planarization process. Upper surfaces of the first interlayer insulating layer 85 and the preliminary stack structure 60T may be exposed at substantially the same surface. The first interlayer insulating layer 85 may be on and, in some embodiments, cover, the preliminary stack structure 60T in the pad region EXT.

A plurality of cell channel structures 69C may be formed in the cell region CEL and a plurality of dummy channel structures 69D may be formed in the pad region EXT. Some of the plurality of cell channel structures 69C may entirely pass through the preliminary stack structure 60T, the support plate 50, and the mold layer 29 and may be formed inside the lower conductive layer 25. Others of the plurality of cell channel structures 69C may entirely pass through the preliminary stack structure 60T and the third cell support bar 33B and may be formed inside the lower conductive layer 25. Some of the plurality of dummy channel structures 69D may entirely pass through the first interlayer insulating layer 85, the preliminary stack structure 60T, the support plate 50, and the mold layer 29 and may be formed inside the lower conductive layer 25. Others of the plurality of dummy channel structures 69D may entirely pass through the first interlayer insulating layer 85, the preliminary stack structure 60T, and the third extension support bar 43B and may be formed inside the lower conductive layer 25.

Each of the plurality of cell channel structures 69C and the plurality of dummy channel structures 69D may include an information storage pattern 64, a channel pattern 65, a core pattern 66, and a first pad 67. The channel pattern 65 may be on (e.g., surround) a side surface and a bottom of the core pattern 66. The first pad 67 may be formed above the channel pattern 65. The core pattern 66 may include an insulating material such as, for example, silicon oxide, silicon nitride, silicon oxynitride, or a combination thereof. The channel pattern 65 may include a semiconductor layer such as, for example, polysilicon. For example, the channel pattern 65 may include a P-type polysilicon layer. The first pad 67 may be in direct contact with the channel pattern 65. The first pad 67 may include a semiconductor layer such as, for example, polysilicon. For example, the first pad 67 may include an N-type polysilicon layer. In some embodiments, the first pad 67 may serve as a drain region. In some embodiments, the first pad 67 may include a conductive material such as, for example, a metal silicide, a metal, a metal nitride, a metal oxide, or a combination thereof.

The information storage pattern 64 may be on (e.g., surround) an outer side of the channel pattern 65. In some embodiments, as shown in FIG. 5, the information storage pattern 64 may include a tunnel insulating layer 64T, a charge storage layer 64E, and a first blocking layer 64B. The tunnel insulating layer 64T may be in direct contact with the channel pattern 65. The charge storage layer 64E may be interposed between the tunnel insulating layer 64T and the first blocking layer 64B. The first blocking layer 64B may be disposed between the preliminary stack structure 60T and the charge storage layer 64E. In some embodiments, the tunnel insulating layer 64T may include, for example, silicon oxide, the charge storage layer 64E may include, for example, silicon nitride, and the first blocking layer 64B may include, for example, silicon oxide, silicon nitride, silicon oxynitride, a high-K dielectric, or a combination thereof.

The first well 23, the first gate dielectric layer 27, the first source/drain regions 71, the first lower gate electrode 73, the first upper gate electrode 75, the first capping pattern 77, and the first gate spacer 79 may constitute a first transistor 81. The first transistor 81 may be a low-voltage transistor. The second well 24, the second gate dielectric layer 28, the second source/drain regions 72, the second lower gate electrode 74, the second upper gate electrode 76, the second capping pattern 78, and the second gate spacer 80 may constitute a second transistor 82. The second transistor 82 may be a high-voltage transistor.

Figure 32:
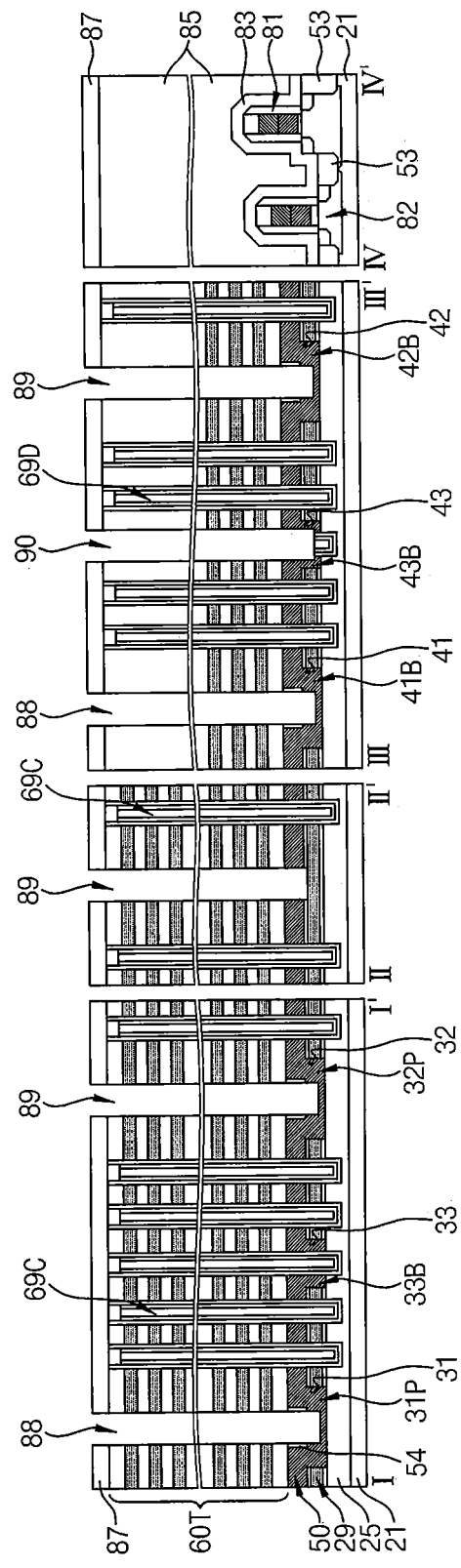

Referring to FIGS. 1 and 32, a second interlayer insulating layer 87 may be formed on the preliminary stack structure 60T and the first interlayer insulating layer 85. The second interlayer insulating layer 87 may be on (e.g., cover) the plurality of cell channel structures 69C and the plurality of dummy channel structures 69D. The second interlayer insulating layer 87 may include an oxide such as, for example, silicon oxide. The second interlayer insulating layer 87, the first interlayer insulating layer 85, the preliminary stack structure 60T, and the supporters 50, 31P, 31AP, 32P, 32AP, 33B, 41B, 42B, 43B, 44B, 45B, 46B, and 47B may be patterned so that a plurality of isolation trenches 88, 89, and 90 may be formed. The plurality of isolation trenches 88, 89, and 90 may include a first isolation trench 88, a second isolation trench 89, and a third isolation trench 90.

The second isolation trench 89 may be parallel to the first isolation trench 88. Each of the first isolation trench 88 and the second isolation trench 89 may cross the cell region CEL and the pad region EXT. The first isolation trench 88 may overlap the plurality of first cell buried trenches 31, the first strapping buried trench 31A, and the first extension buried trench 41. The second isolation trench 89 may overlap the plurality of second cell buried trenches 32, the second strapping buried trench 32A, and the second extension buried trench 42. The third isolation trench 90 may be formed between the first isolation trench 88 and the second isolation trench 89. The third isolation trench 90 may be disposed in the pad region EXT. The third isolation trench 90 may be disposed toward the cell region CEL at an edge of the pad region EXT. The third isolation trench 90 may partially overlap the third extension buried trench 43.

Figure 33:
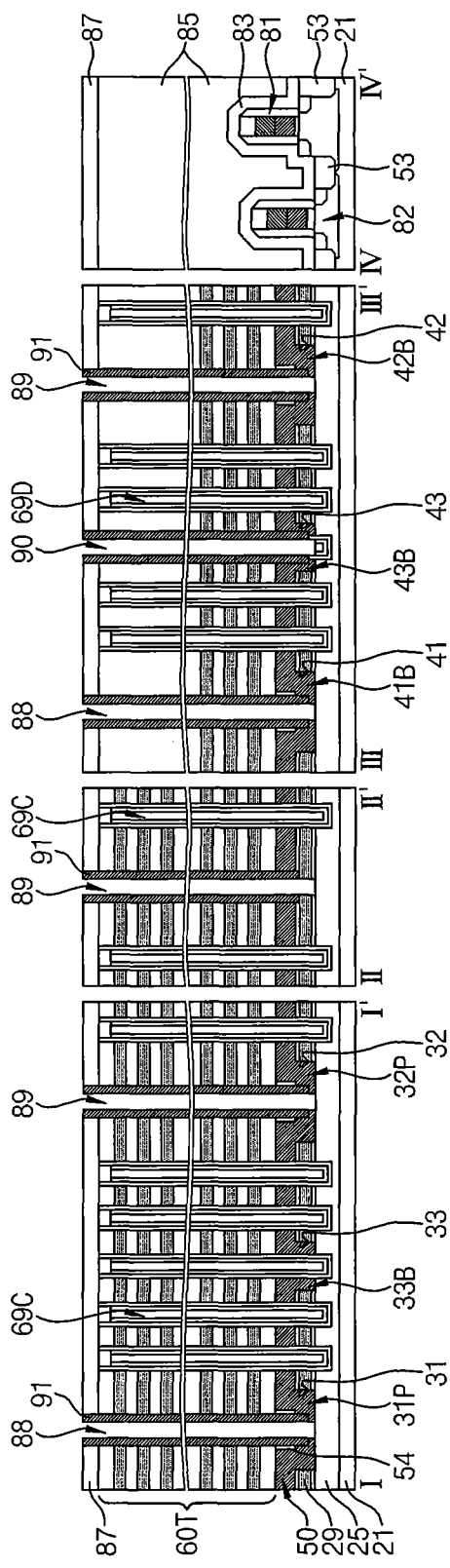

Referring to FIGS. 1 and 33, sidewall spacers 91 may be formed at sidewalls of the plurality of isolation trenches 88, 89, and 90. The process of forming the sidewall spacers 91 may include a thin film forming process and an anisotropic etching process. The sidewall spacers 91 may include a material having an etch selectivity with respect to the mold layer 29. For example, the sidewall spacers 91 may include polysilicon. The plurality of isolation trenches 88, 89, and 90 may pass through the second interlayer insulating layer 87, the first interlayer insulating layer 85, the preliminary stack structure 60T, and the supporters 50, 31P, 31AP, 32P, 32AP, 33B, 41B, 42B, 43B, 44B, 45B, 46B, and 47B.

In the cell region CEL, the first isolation trench 88 and the second isolation trench 89 may pass through the support plate 50 so that the mold layer 29 may be exposed. In the cell region CEL, the first isolation trench 88 and the second isolation trench 89 may pass through the plurality of first cell support patterns 31P, the first strapping support pattern 31AP, the plurality of second cell support patterns 32P, and the second strapping support pattern 32AP so that the lower conductive layer 25 may be exposed. In the pad region EXT, the first isolation trench 88, the second isolation trench 89, and the third isolation trench 90 may pass through the first extension support bar 41B, the second extension support bar 42B, and the third extension support bar 43B so that the lower conductive layer 25 may be exposed.

Figure 34:
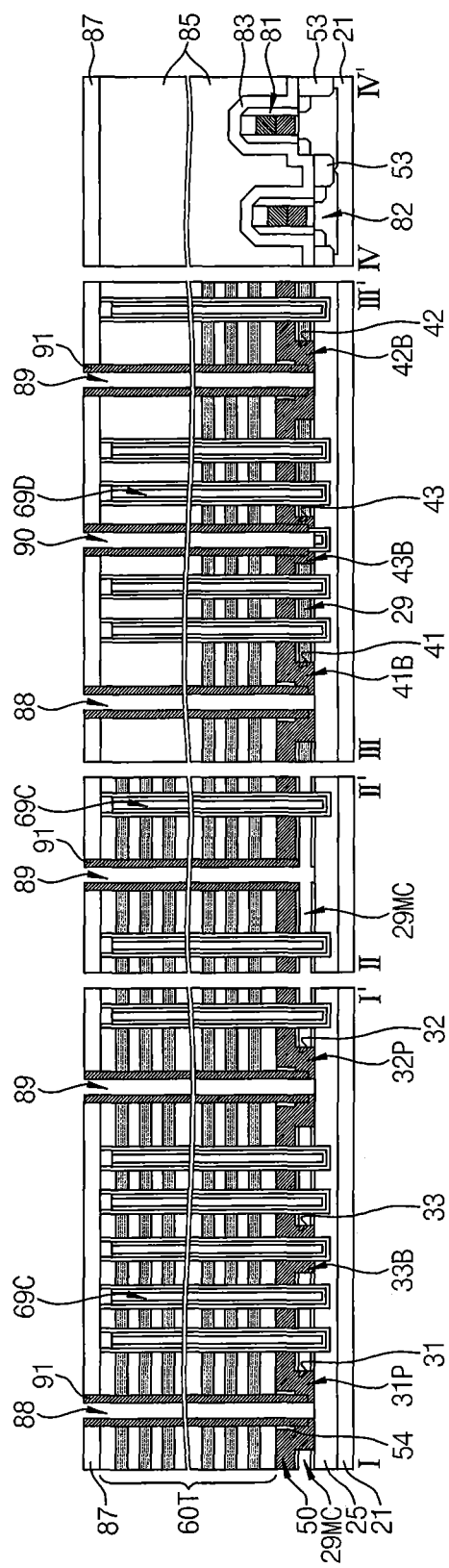

Referring to FIGS. 1 and 34, in the cell region CEL, a preliminary cavity 29MC may be formed by removing the intermediate mold layer 29M. The mold layer 29 may remain in the pad region EXT.

Figure 35:
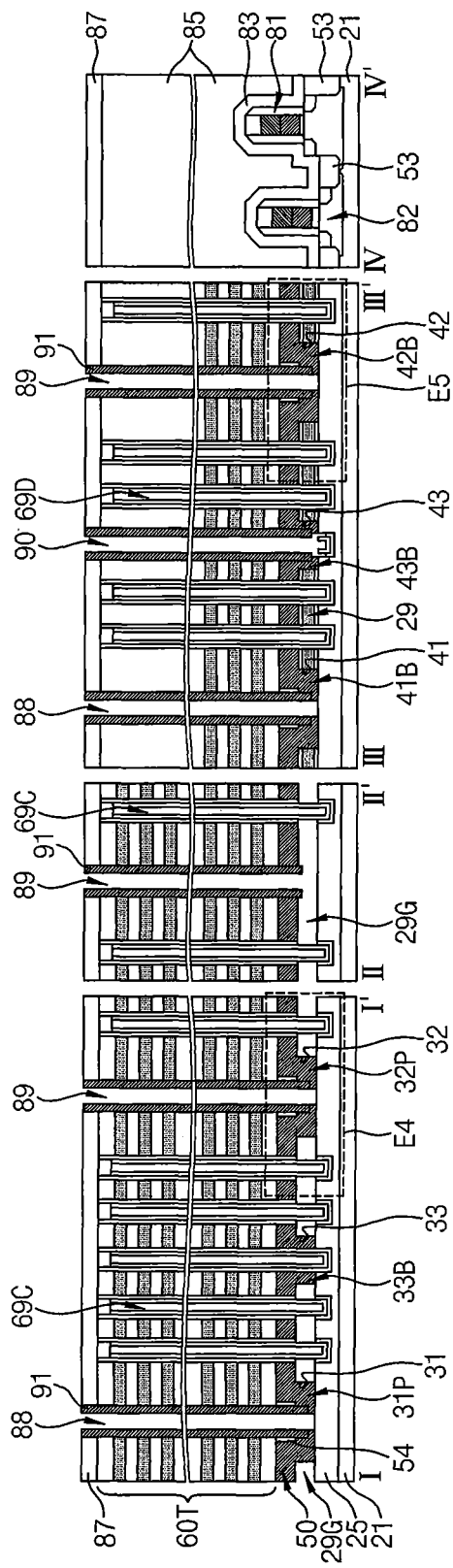
Figure 36:
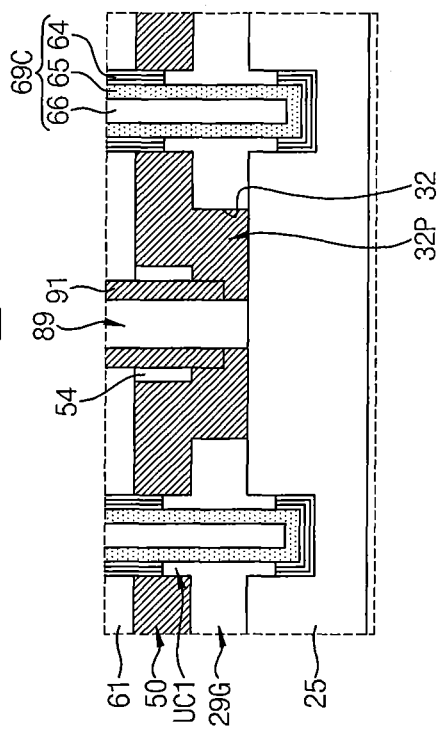

Referring to FIGS. 1 and 35, in the cell region CEL, a cavity 29G may be formed by removing the mold layer 29. The mold layer 29 may remain in the pad region EXT.

Referring to FIG. 36, lower surfaces of the support patterns 31P, 31AP, 32P, and 32AP and the support bars 33B, 41B, 42B, 43B, 44B, 45B, 46B, and 47B may be in direct contact with the lower conductive layer 25. For example, the lower surfaces of the plurality of second cell support patterns 32P may be in direct contact with the lower conductive layer 25. In the cell region CEL, when the mold layer 29 is removed to form the cavity 29G the information storage pattern 64 may be partially removed so that a side surface of the channel pattern 65 may be exposed. The information storage pattern 64 may be partially removed so that a first undercut region UC1 may be formed between the support plate 50 and the channel pattern 65. The first undercut region UC1 may communicate with (e.g., be connected to) the cavity 29G.

Referring to FIG. 37, in the pad region EXT, the first extension support bar 41B, the second extension support bar 42B, and the third extension support bar 43B may remain between the mold layer 29 and the plurality of isolation trenches 88, 89, and 90. When the cavity 29G is formed in the cell region CEL, the first extension support bar 41B, the second extension support bar 42B, and the third extension support bar 43B may prevent the mold layer 29 in the pad region EXT from being removed. The mold layer 29 may remain in the pad region EXT.

Referring to FIG. 38, portions of the lower mold layer 29A may remain between the support patterns 31P, 31AP, 32P, and 32AP and the lower conductive layer 25 and between the support bars 33B, 41B, 42B, 43B, 44B, 45B, 46B, and 47B and the lower conductive layer 25. For example, portions of the lower mold layer 29A may remain between the plurality of second cell support patterns 32P and the lower conductive layer 25. In the cell region CEL, when the mold layer 29 is removed to form the cavity 29G, a second undercut region UC2 and a third undercut region UC3 may be formed between the support patterns 31P, 31AP, 32P, and 32AP and the lower conductive layer 25. For example, the second undercut region UC2 and the third undercut region UC3 may be formed between the plurality of second cell support patterns 32P and the lower conductive layer 25. The second undercut region UC2 may communicate with (e.g., be connected to) the cavity 29G The third undercut region UC3 may communicate with (e.g., be connected to) the second isolation trench 89.

Referring to FIG. 39, the lower mold layer 29A may remain between the support bars 33B, 41B, 42B, 43B, 44B, 45B, 46B, and 47B and the lower conductive layer 25. In the pad region EXT, a fourth undercut region UC4 may be formed between the first extension support bar 41B and the lower conductive layer 25, between the second extension support bar 42B and the lower conductive layer 25, and between the third extension support bar 43B and the lower conductive layer 25. For example, the fourth undercut region UC4 may communicate with (e.g., be connected to) the second isolation trench 89.

Referring to FIG. 40, in some embodiments, the sidewall spacers 91 may be in direct contact with the lower conductive layer 25. Portions of the lower mold layer 29A may remain between the support patterns 31P, 31AP, 32P, and 32AP and the lower conductive layer 25 and between the support bars 33B, 41B, 42B, 43B, 44B, 45B, 46B, and 47B and the lower conductive layer 25. For example, portions of the lower mold layer 29A may remain between the plurality of second cell support patterns 32P and the lower conductive layer 25. In the cell region CEL, when the mold layer 29 is removed to form the cavity 29G, the second undercut region UC2 may be formed between the support patterns 31P, 31AP, 32P, and 32AP and the lower conductive layer 25. For example, the second undercut region UC2 may be formed between the plurality of second cell support patterns 32P and the lower conductive layer 25. The second undercut region UC2 may communicate with (e.g., be connected to) the cavity 29G. For example, as compared to FIG. 38, a third undercut region UC3 may not be formed.

Referring to FIG. 41, the lower mold layer 29A may remain between the support bars 33B, 41B, 42B, 43B, 44B, 45B, 46B, and 47B and the lower conductive layer 25. For example, in the pad region EXT, the lower mold layer 29A may remain between the second extension support bar 42B and the lower conductive layer 25. For example, as compared to FIG. 39, a fourth undercut region UC4 may not be formed.

Figure 42:
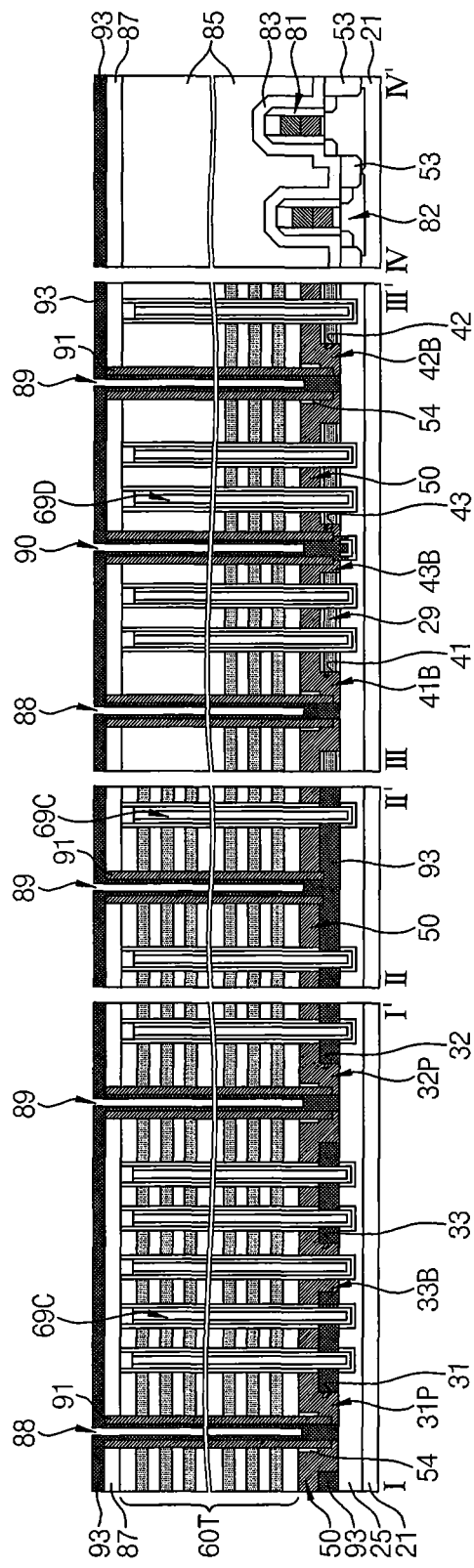

Referring to FIGS. 1 and 42, a replacement conductive line 93 may be formed in the cavity 29G. The replacement conductive line 93 may be in direct contact with the side surface of the channel pattern 65. The replacement conductive line 93 may include a conductive material such as, for example, N-type polysilicon or P-type polysilicon. In some embodiments, the replacement conductive line 93 may include, for example, a metal, a metal silicide, a metal nitride, a metal oxide, or a combination thereof. The replacement conductive line 93 may be formed at substantially the same level as the mold layer 29. In some embodiments, the replacement conductive line 93 may be provided as a common source line (CSL). The replacement conductive line 93 may be on (e.g., cover) the second interlayer insulating layer 87 and insides of the plurality of isolation trenches 88, 89, and 90.

Figure 43:
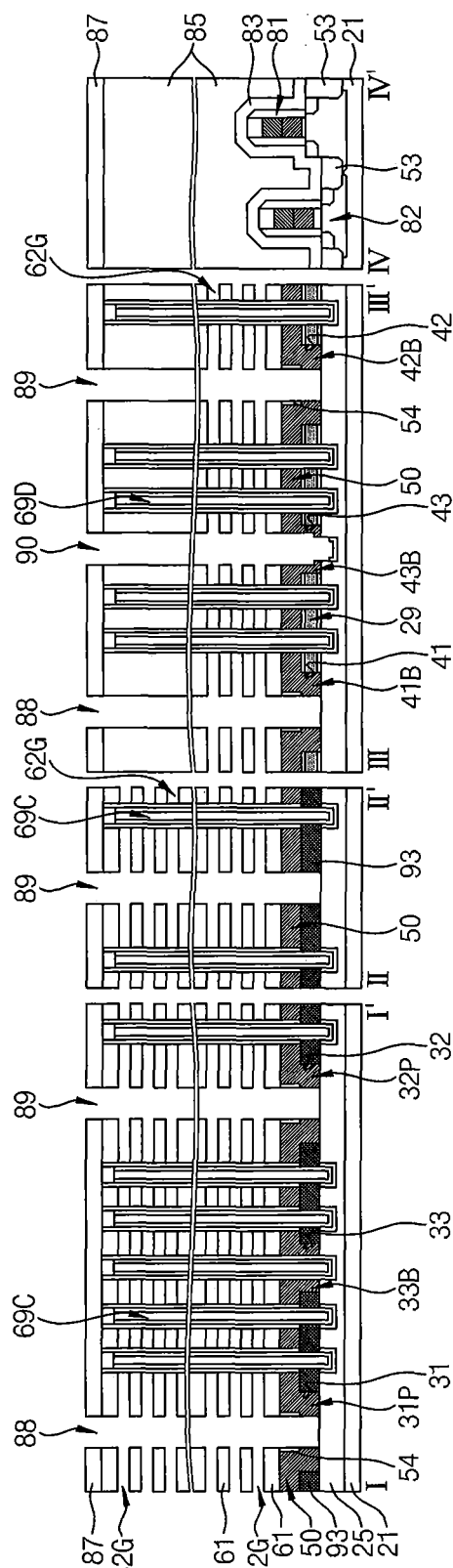

Referring to FIGS. 1 and 43, the replacement conductive line 93 may be partially removed and the sidewall spacers 91 may be removed, so that the plurality of isolation trenches 88, 89, and 90 may be exposed. A plurality of gap regions 62G which communicate with (e.g., are connected to) the plurality of isolation trenches 88, 89, and 90 may be formed by removing the plurality of sacrificial layers 62.

Figure 44:
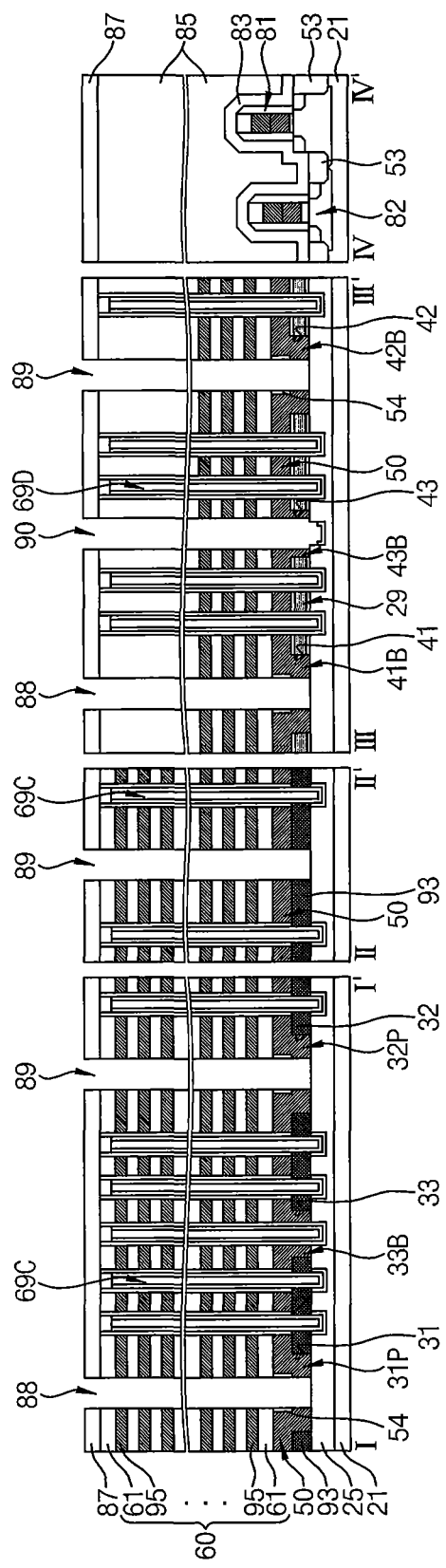

Referring to FIGS. 1 and 44, a plurality of conductive layers 95 may be formed in the plurality of gap regions 62G The plurality of insulating layers 61 and the plurality of conductive layers 95 which are alternately and repeatedly stacked may constitute a stack structure 60. The plurality of conductive layers 95 may include, for example, a metal, a metal silicide, a metal nitride, a metal oxide, polysilicon, a conductive carbon, or a combination thereof. The process of forming the plurality of conductive layers 95 may include a thin film forming process and an anisotropic etching process. The lower conductive layer 25 may be exposed at bottoms of the plurality of isolation trenches 88, 89, and 90.

In some embodiments, as shown in FIG. 4, the information storage pattern 64 may include a tunnel insulating layer 64T, a charge storage layer 64E, a first blocking layer 64B, and a second blocking layer 64B2. The second blocking layer 64B2 may be interposed between the plurality of conductive layers 95 and the first blocking layer 64B. The second blocking layer 64B2 may extend on an upper surface and a lower surface of each of the plurality of conductive layers 95. The second blocking layer 64B2 may include, for example, silicon oxide, silicon nitride, silicon oxynitride, a high-K dielectric material, or a combination thereof.

Figure 45:
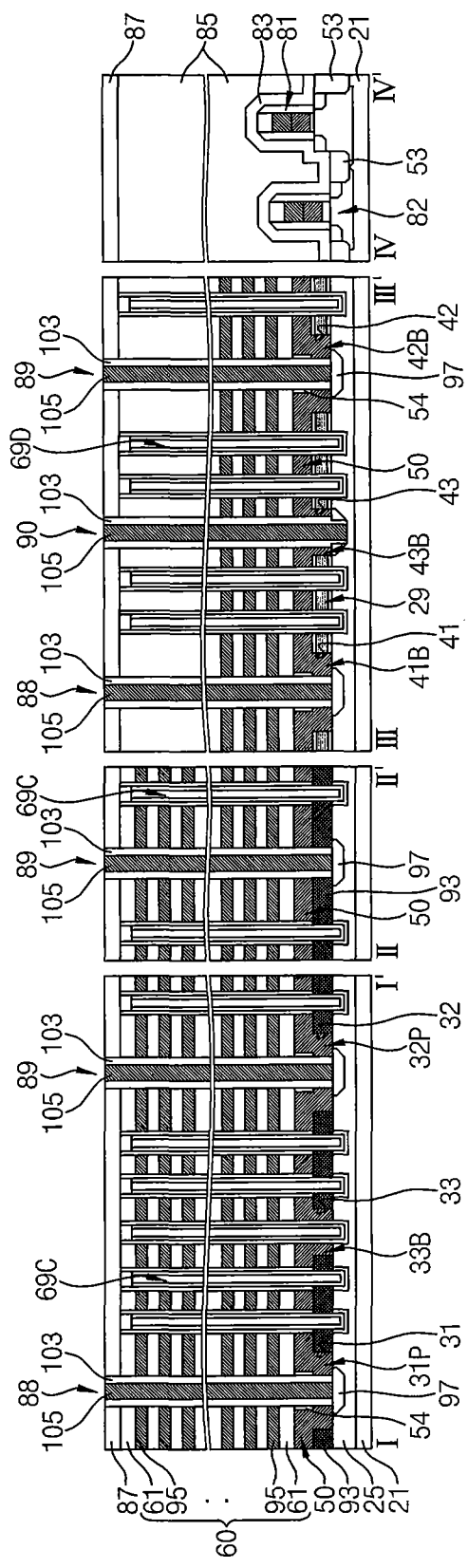

Referring to FIGS. 1 and 45, impurity regions 97 may be formed in the lower conductive layer 25 exposed at the bottoms of the plurality of isolation trenches 88, 89, and 90. An insulating spacer 103 may be formed at the sidewalls of the plurality of isolation trenches 88, 89, and 90. A trench buried layer 105 may be formed in the plurality of isolation trenches 88, 89, and 90. In some embodiments, the impurity regions 97 may include N-type impurities. The insulating spacer 103 may include, for example, silicon oxide, silicon nitride, silicon oxynitride, a low-K dielectric material, a high-K dielectric material, or a combination thereof. The trench buried layer 105 may include, for example, a metal, a metal silicide, a metal nitride, a metal oxide, polysilicon, a conductive carbon, or a combination thereof. In some embodiments, the trench buried layer 105 may include, for example, an insulating material such as silicon oxide, silicon nitride, silicon oxynitride, a low-K dielectric material, a high-K dielectric material, or a combination thereof.

Figure 46:
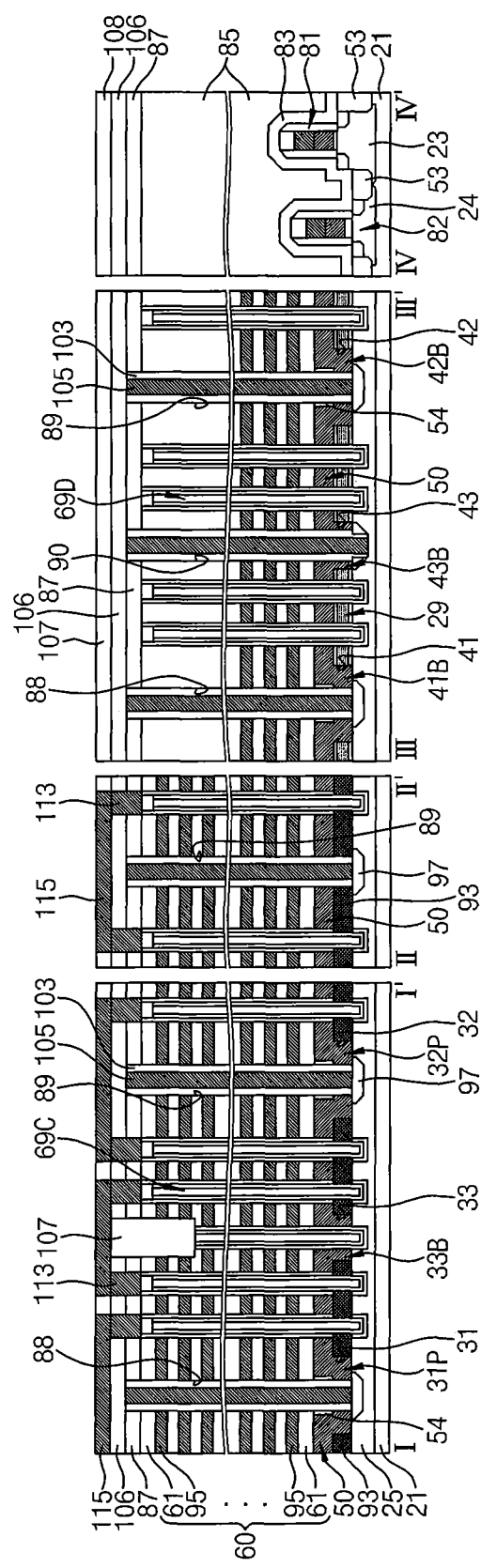

Referring to FIGS. 1 and 46, a third interlayer insulating layer 106 may be formed on the second interlayer insulating layer 87. A selective line separation pattern 107 may be formed to pass through the third interlayer insulating layer 106 and the second interlayer insulating layer 87 and partially pass through the stack structure 60. In some embodiments, the selective line separation pattern 107 may pass through an uppermost layer of the plurality of conductive layers 95 and a layer below the uppermost layer. The selective line separation pattern 107 may be disposed above the third cell buried trench 33 and the third extension buried trench 43. A plurality of sub-bit plugs 113 that pass through the third interlayer insulating layer 106 and the second interlayer insulating layer 87 to be connected to the plurality of cell channel structures 69C may be formed. A fourth interlayer insulating layer 108 may be formed on the third interlayer insulating layer 106. A plurality of sub-bit lines 115 connected to the plurality of sub-bit plugs 113 may be formed in the fourth interlayer insulating layer 108.

Referring again to FIGS. 1 and 2, a fifth interlayer insulating layer 121 may be formed on the plurality of sub-bit lines 115. A plurality of bit plugs 123 connected to the plurality of sub-bit lines 115 may be formed in the fifth interlayer insulating layer 121. A bit line 125 connected to the plurality of bit plugs 123 may be formed on the fifth interlayer insulating layer 121. The third interlayer insulating layer 106, the selective line separation pattern 107, the fourth interlayer insulating layer 108, and the fifth interlayer insulating layer 121 may include an insulating material such as, for example, silicon oxide, silicon nitride, silicon oxynitride, a low-K dielectric material, or a combination thereof. The plurality of sub-bit plugs 113, the plurality of sub-bit lines 115, the plurality of bit plugs 123, and the bit line 125 may include, for example, a metal, a metal silicide, a metal nitride, a metal oxide, polysilicon, a conductive carbon, or a combination thereof.

According to the example embodiments of the inventive concepts, a 3D semiconductor device including a supporter, a replacement conductive line, and a stack structure is provided. The supporter can include a support plate, a support pattern, and/or a support bar. The supporter can reduce and/or prevent damage to the stack structure while the process of forming the replacement conductive line is performed. A 3D semiconductor device having a stable structure with a simplified process can be realized.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the embodiments of the present inventive concepts have been described with reference to the accompanying drawings, it should be understood by those skilled in the art that various modifications may be made without departing from the scope of the present inventive concepts and without changing essential features thereof. Therefore, the above-described embodiments should be considered in a descriptive sense only and not for purposes of limitation.

What is claimed is:

1. A semiconductor device comprising:
   a lower conductive layer on a substrate;
   a conductive line on the lower conductive layer;
   a buried trench in the conductive line;
   a supporter on the conductive line and extending in the buried trench;
   a stack structure comprising a plurality of insulating layers and a plurality of conductive layers that are alternately stacked on the supporter;
   a channel structure that passes through the stack structure, the supporter, and the conductive line; and
   an isolation trench that passes through the stack structure, the supporter, and the conductive line.

2. The semiconductor device of claim 1, wherein the supporter comprises:
   a support plate on the conductive line; and
   a support pattern in the buried trench and connected with the support plate.

3. The semiconductor device of claim 2, wherein the isolation trench passes through the support pattern.

4. The semiconductor device of claim 2, wherein the support pattern comprises a same material as the support plate.

5. The semiconductor device of claim 2, wherein the support pattern and the support plate comprise polysilicon.

6. The semiconductor device of claim 2, wherein a lower end of the support pattern is in direct contact with the lower conductive layer.

7. The semiconductor device of claim 2, wherein the conductive line is in direct contact with the lower conductive layer and the support plate.

8. The semiconductor device of claim 2, further comprising a lower mold layer between the support pattern and the lower conductive layer.

9. The semiconductor device of claim 1, wherein the channel structure comprises:
   a core pattern;
   a channel pattern on an outer side of the core pattern; and
   an information storage pattern on an outer side of the channel pattern,
   wherein the conductive line passes through the information storage pattern to be in direct contact with a side surface of the channel pattern.

10. A semiconductor device comprising:
    a substrate comprising a cell region and a pad region;
    a lower conductive layer on the substrate;
    a mold layer in the pad region on the lower conductive layer;
    a conductive line in the cell region on the lower conductive layer and at a substantially same level as the mold layer;
    a plurality of buried trenches in the conductive line and the mold layer;
    a supporter on the conductive line and the mold layer and extending in the plurality of buried trenches;
    a stack structure comprising a plurality of insulating layers and a plurality of conductive layers that are alternately stacked on the supporter;
    a cell channel structure that passes through the stack structure, the supporter, and the conductive line;
    a dummy channel structure that passes through the stack structure, the supporter, and the mold layer; and
    a plurality of isolation trenches that pass through the stack structure, the supporter, and the conductive line.

11. The semiconductor device of claim 10, wherein the supporter comprises:

a support plate;
a support pattern in the plurality of buried trenches in the cell region and connected with the support plate; and
a support bar in the plurality of buried trenches in the pad region and connected with the support plate.

12. The semiconductor device of claim 11, wherein at least one of the plurality of isolation trenches passes through the support pattern and the support bar.

13. A semiconductor device comprising:
a substrate comprising a cell region and a pad region adjacent to the cell region;
a lower conductive layer on the substrate;
a mold layer in the pad region on the lower conductive layer;
a conductive line in the cell region on the lower conductive layer and at a substantially same level as the mold layer;
a first extension buried trench in the mold layer;
a second extension buried trench spaced apart from the first extension buried trench and in the mold layer;
a supporter on the conductive line and the mold layer and extending in the first extension buried trench and the second extension buried trench;
a stack structure comprising a plurality of insulating layers and a plurality of conductive layers that are alternately stacked on the supporter;
a plurality of cell channel structures that pass through the stack structure, the supporter, and the conductive line;
a plurality of dummy channel structures that pass through the stack structure, the supporter, and the mold layer between the first extension buried trench and the second extension buried trench; and
a plurality of isolation trenches that pass through the stack structure, the supporter, and the conductive line.

14. The semiconductor device of claim 13, wherein the supporter comprises:
a support plate on the conductive line and the mold layer;
a first extension support bar in the first extension buried trench and connected with the support plate; and
a second extension support bar in the second extension buried trench and connected with the support plate.

15. The semiconductor device of claim 14, further comprising:
a third extension buried trench in the mold layer between the first extension buried trench and the second extension buried trench; and
a third extension support bar in the third extension buried trench and connected with the support plate.

16. The semiconductor device of claim 15, further comprising:
a fourth extension buried trench in the mold layer between the first extension buried trench and the third extension buried trench;
a fourth extension support bar in the fourth extension buried trench and connected with the support plate;
a fifth extension buried trench in the mold layer between the second extension buried trench and the third extension buried trench; and
a fifth extension support bar in the fifth extension buried trench and connected with the support plate,
wherein the fourth extension buried trench and the fifth extension buried trench are adjacent to a boundary between the cell region and the pad region.

17. The semiconductor device of claim 16, wherein:
the fourth extension buried trench is connected to the first extension buried trench and the third extension buried trench; and
the fifth extension buried trench is connected to the second extension buried trench and the third extension buried trench.

18. The semiconductor device of claim 16, further comprising:
a sixth extension buried trench in the mold layer between the first extension buried trench and the third extension buried trench;
a sixth extension support bar in the sixth extension buried trench and connected with the support plate;
a seventh extension buried trench in the mold layer between the second extension buried trench and the third extension buried trench; and
a seventh extension support bar in the seventh extension buried trench and connected with the support plate,
wherein the sixth extension buried trench is opposite the fourth extension buried trench and the seventh extension buried trench is opposite the fifth extension buried trench.

19. The semiconductor device of claim 18, wherein:
the sixth extension buried trench is connected to the first extension buried trench and the third extension buried trench; and
the seventh extension buried trench is connected to the second extension buried trench and the third extension buried trench.

20. The semiconductor device of claim 15, further comprising:
a plurality of first cell buried trenches in the conductive line and aligned on an extension line of the first extension buried trench;
a plurality of first cell support patterns in the plurality of first cell buried trenches and connected with the support plate;
a plurality of second cell buried trenches in the conductive line and aligned on an extension line of the second extension buried trench; and
a plurality of second cell support patterns in the plurality of second cell buried trenches and connected with the support plate.

* * * * *